United States Patent
Aoyama et al.

(10) Patent No.: US 10,196,547 B2
(45) Date of Patent: Feb. 5, 2019

(54) RESIN COMPOSITION FOR SEALING ELECTRONIC DEVICE, AND ELECTRONIC DEVICE

(71) Applicant: FURUKAWA ELECTRIC CO., LTD., Tokyo (JP)

(72) Inventors: Masami Aoyama, Tokyo (JP); Takumi Asanuma, Tokyo (JP); Yasushi Ishizaka, Tokyo (JP)

(73) Assignee: FURUKAWA ELECTRICS CO., LTD., Tokyo (JP)

( * ) Notice: Subject to any disclaimer, the term of this patent is extended or adjusted under 35 U.S.C. 154(b) by 113 days.

(21) Appl. No.: 15/248,366

(22) Filed: Aug. 26, 2016

(65) Prior Publication Data

US 2016/0362587 A1 Dec. 15, 2016

Related U.S. Application Data

(63) Continuation of application No. PCT/JP2015/053121, filed on Feb. 4, 2015.

(30) Foreign Application Priority Data

Feb. 28, 2014 (JP) ................................. 2014-037962

(51) Int. Cl.
  *H02N 6/00* (2006.01)
  *H01L 31/042* (2014.01)
  (Continued)

(52) U.S. Cl.
  CPC ......... *C09J 119/006* (2013.01); *C08F 299/00* (2013.01); *C09K 3/1006* (2013.01);
  (Continued)

(58) Field of Classification Search
  CPC .................................................. C09D 115/00
  See application file for complete search history.

(56) References Cited

U.S. PATENT DOCUMENTS 5,387,445 A * 2/1995 Horiuchi ............... G02F 1/1339
  349/153
7,687,991 B2 3/2010 Horikiri
  (Continued)

FOREIGN PATENT DOCUMENTS

CN 102301524 A 12/2011
EP 2 395 596 A1 12/2011
  (Continued)

OTHER PUBLICATIONS

English machine translation of JP2010180258A. (Year: 2018).*
  (Continued)

*Primary Examiner* — Angelo Trivisonno
(74) *Attorney, Agent, or Firm* — Oblon, McClelland, Maier & Neustadt, L.L.P.

(57) ABSTRACT

A resin composition for sealing an electronic device and other things being capable of sealing an electronic device without trapping air and being capable of suppressing the permeation of water vapor is provided. The present invention includes a polybutadiene polymer represented by chemical formula (1) and having a (meth) acryloyl group at a terminal end; and a photopolymerization initiator, and does not include a thermoplastic resin having a mass-average molecular weight of 50,000 or more:

(1)

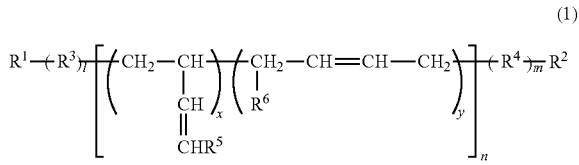

wherein $R^1$ and $R^2$ each represent a hydroxyl group or $H_2C{=}C(R^7){-}COO{-}$; $R^3$ and $R^4$ each represent a C1-C16
  (Continued)

substituted or unsubstituted, non-N-containing divalent organic group; $R^5$, $R^6$ and $R^7$ each represent a hydrogen atom or a C1-C10 alkyl group; l and m each represent 0 or 1; n represents an integer from 15 to 150; and x:y=0 to 100:100 to 0; $R^1$ and $R^2$ are never both a hydroxyl group.

13 Claims, 2 Drawing Sheets

(51) Int. Cl.
| | |
|---|---|
| *C09J 119/00* | (2006.01) |
| *C08F 299/00* | (2006.01) |
| *H01L 51/52* | (2006.01) |
| *H01L 31/048* | (2014.01) |
| *C09K 3/10* | (2006.01) |
| *H01L 23/29* | (2006.01) |
| *H01L 51/00* | (2006.01) |
| *H01L 51/44* | (2006.01) |

(52) U.S. Cl.
CPC ........ *H01L 23/293* (2013.01); *H01L 31/0481* (2013.01); *H01L 51/004* (2013.01); *H01L 51/448* (2013.01); *H01L 51/5246* (2013.01); *C09K 2200/0617* (2013.01); *H01L 2924/0002* (2013.01); *Y02E 10/549* (2013.01)

(56) References Cited

U.S. PATENT DOCUMENTS

| | | | |
|---|---|---|---|
| 2008/0012473 A1 | 1/2008 | Horikiri | |
| 2009/0030107 A1* | 1/2009 | Watanabe | C08F 290/046 522/171 |
| 2013/0286604 A1* | 10/2013 | Yoshida | C08K 5/09 361/748 |
| 2014/0138013 A1* | 5/2014 | Attarawala | B32B 37/12 156/64 |
| 2015/0079379 A1 | 3/2015 | Suzuki et al. | |

FOREIGN PATENT DOCUMENTS

| | | | | |
|---|---|---|---|---|
| JP | 59-93715 | 5/1984 | | |
| JP | 64-20213 | 1/1989 | | |
| JP | 64-81813 | 3/1989 | | |
| JP | 1-113417 | 5/1989 | | |
| JP | 6-220305 | 8/1994 | | |
| JP | 7-33837 | 2/1995 | | |
| JP | 2002-371205 | 12/2002 | | |
| JP | 2004-231938 | 8/2004 | | |
| JP | 2006-8819 | 1/2006 | | |
| JP | 2006-36947 | 2/2006 | | |
| JP | 2006-124411 | 5/2006 | | |
| JP | 2006-183002 | 7/2006 | | |
| JP | 2006-185646 | 7/2006 | | |
| JP | 2006-298964 | 11/2006 | | |
| JP | 2008-21480 | 1/2008 | | |
| JP | 2008-95039 | 4/2008 | | |
| JP | 2010-72471 | 4/2010 | | |
| JP | 2010180258 A | * | 8/2010 | .......... H01G 9/2077 |
| JP | 2011-116965 | 6/2011 | | |
| JP | 2013-214366 | 10/2013 | | |
| JP | 2013-216782 | 10/2013 | | |
| KR | 10-2007-0039880 A | 4/2007 | | |
| WO | WO 2006/001522 A1 | 1/2006 | | |
| WO | WO 2010/033419 A2 | 3/2010 | | |
| WO | WO 2013/031678 A1 | 3/2013 | | |
| WO | WO 2013/187508 A1 | 12/2013 | | |

OTHER PUBLICATIONS

Chinese Office Action dated Nov. 15, 2017 in Patent Application No. 201580010496.3 (with English translation).
International Search Report dated May 12, 2015 in PCT/JP2015/053121, filed on Feb. 4, 2015.
Japanese Office action dated Nov. 28, 2014 in Japanese Application No. 2014-037962 ( with English translation).
Japanese Office action dated Feb. 20, 2015 in Japanese Application No. 2014-037962 ( with English translation).
Taiwanese Office action dated Mar. 10, 2016 in Taiwan Patent Application No. 104106042 ( with English Translation).
Korean Office Action dated Sep. 5, 2017 in Patent Application No. 10-2016-7025244 (with English translation).
Combined Chinese Office Action and Search Report dated May 4, 2017 in Patent Application No. 201580010496.3 (with English Translation and English Translation of Category of Cited Documents).

* cited by examiner

RESIN COMPOSITION FOR SEALING ELECTRONIC DEVICE, AND ELECTRONIC DEVICE

TECHNICAL FIELD

The present invention relates to a sealing resin composition for use in electronic devices, and an electronic device sealed using the sealing resin composition.

BACKGROUND ART

In regard to organic electronic devices and circuits thereof, various package structures are known. These structures are generally configured to include a substrate; a cover; an organic active component part disposed between the substrate and the cover, such as a light emitting diode; and a sealing material for sealing the organic active component part and also bonding the substrate and the cover. One or both of the substrate and the cover are produced from a transparent material, for example, transparent glass or a transparent plastic, and can transmit light. The substrate and the cover may be flexible, and any one of them may also be constructed from steel, in addition to glass or a plastic. According to a certain embodiment in which the organic active component part is formed on a substrate, the organic active component part is covered with a coating film composed of an inorganic barrier film or of a multilayer barrier film having inorganic and organic layers laminated together. The coating film protects the surface and the periphery of the organic active component part. The sealing material may be applied or pasted on the organic active component part; however, in a case in which a coating film is available, the sealing material may be applied or pasted thereon. Such a sealing material wraps up the organic active component part and thereby fills the space between the substrate and the cover, and the sealing material affixes the substrate to the cover.

However, the organic active component parts are prone to deterioration by low molecular weight components, oxygen or water vapor. For example, an organic electroluminescent device is composed of an anode, a light emitting layer and a cathode, and a metal layer having a low work function is utilized as the cathode, so that efficient electron injection and a low operating voltage are guaranteed. A metal having a low work function is chemically reactive with oxygen and water vapor, and such a reaction shortens the service life of a device. Furthermore, oxygen and water vapor react with organic luminescent materials and thereby suppress light emission. In order to prevent the occurrence of such a reaction, a coating film is provided on the surface of an organic active component part in many cases as described above. However, it is difficult to suppress pinholes with an inorganic barrier film, and the inorganic barrier film cannot perfectly shield an organic active component part from oxygen or water vapor coming from the outside. Therefore, a sealing material that wraps an organic active component part is designed so as to be able to suppress permeation of oxygen and water vapor, particularly water vapor, coming from the outside, irrespective of the presence or absence of a coating film.

Regarding such a sealing material, a film-like curable sealing material can be used (see, for example, Patent Document 1). Generally, a film-like sealing material is provided between two support films, and after one of these support films is removed, the exposed film-like sealing material is adhered to any one of the cover or the substrate by pressing or by heating and pressing. Thereafter, the other support film is removed, and the cover and the substrate are adhered to each other. The film-like sealing material is cured by ultraviolet irradiation or heat, if necessary.

Furthermore, a liquid sealing material can also be used as such a sealing material (see, for example, Patent Document 2). Generally, a liquid sealing material is applied on the entire surface of any one of a cover or a substrate, and then similarly to the film-like sealing material, the cover and the substrate can be adhered to each other by pressing or by heating and pressing the other one of the cover or the substrate. A liquid sealing material generally needs curing, and is cured by ultraviolet radiation or heat.

A film-like sealing material generally has a viscosity that is higher than that of a liquid sealing material at room temperature. When a film-like sealing material is used at room temperature, wetting toward a substrate or a cover is poor. Also, in some cases, the sealing material hardly flows, and air is trapped between the sealing material and the substrate. In order to fluidize the sealing material and to minimize the amount of trapped air by achieving satisfactory wetting, it may be considered to paste the film-like sealing material at a high temperature. The heating temperature may exceed 100° C., and thus, a special apparatus is needed. Furthermore, a film-like sealing material requires the use, removal and disposal of support films.

Regarding the liquid sealing material, a sealing material using a compound resin having an epoxy group or an oxetanyl group (see, for example, Patent Document 2), a sealing material using a cyanoacrylate-based monomer which is ionically polymerizable (see, for example, Patent Document 3), and a sealing material using a bisphenol type epoxy acrylate and an epoxy resin (see, for example, Patent Document 4) have been disclosed. However, these have an insufficient effect of suppressing the permeation of water vapor and insufficient bending resistance after being cured. Thus, as a sealing material having a high effect of suppressing the permeation of water vapor and excellent bending resistance after being cured, a sealing material formed from a hydrogenated polybutadiene having its ends modified with a group having a urethane bond and a (meth) acrylate group (see, for example, Patent Document 5) has been disclosed.

CITATION LIST

Patent Document

Patent Document 1: JP 2013-214366 A
Patent Document 2: JP 2004-231938 A
Patent Document 3: JP 2008-021480 A
Patent Document 4: JP 2006-183002 A
Patent Document 5: JP 2011-116965 A

SUMMARY OF THE INVENTION

Problem to be Solved by the Invention

The sealing material described in Patent Document 5 is a polybutadiene modified with a group having a urethane bond and a (meth) acrylate group at the ends, and does not contain an ether or an ester in the main chain. This polybutadiene can be crosslinked and cured by application of ultraviolet radiation or heat. Therefore, the sealing material has a high effect of suppressing the permeation of water vapor. Furthermore, since the polybutadiene has a (meth) acrylate group at either end, crosslinking points exist at appropriate distances between one another, and because the crosslinking point density does not become excessively high, the sealing material has excellent bending resistance after being cured. On the other hand, since the sites modified with a group having a urethane bond form hydrogen bonds with one another, an interaction occurs between polybutadiene molecules, and the viscosity of the sealing material can be increased. Thereby, in a case in which the sealing material seals a device by wrapping not only the organic active component part but also the terminal electrodes, or in a case in which the organic device is large, and it is needed to apply the sealing material uniformly in a large area, the sealing material may have insufficient fluidity, and air may be trapped between the sealing material and the substrate. When a diluent component is added to the sealing material, the viscosity may be decreased; however, generally, diluent components are low molecular weight components. Therefore, organic active component parts are prone to deterioration, and the sealing material can be easily penetrated by water vapor.

Thus, it is an object of the invention to provide a resin composition for sealing an electronic device, the resin composition being capable of sealing an electronic device without trapping air between the resin composition and a substrate and of suppressing permeation of water vapor, and an electronic device in which the resin composition for sealing an electronic device is applied.

Means for Solving Problem

In order to solve the problems described above, the resin composition for sealing an electronic device according to the invention includes (A) a polybutadiene polymer represented by the following formula (1), the polybutadiene polymer having a (meth) acryloyl group at a terminal end thereof; and (B) a photopolymerization initiator, characterized in that the resin composition does not include a thermoplastic resin having a mass average molecular weight of 50,000 or more:

[Chemical Formula 1]

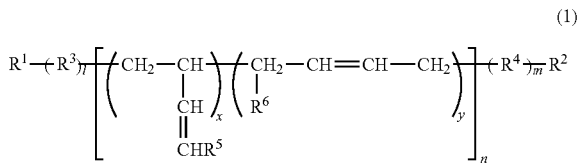

(1)

wherein $R^1$ and $R^2$ each independently represent a hydroxyl group or $H_2C=C(R^7)-COO-$; $R^3$ and $R^4$ each independently represent a substituted or unsubstituted, non-N-containing divalent organic group having 1 to 16 carbon atoms; $R^5$, $R^6$ and $R^7$ each independently represent a hydrogen atom or an alkyl group having 1 to 10 carbon atoms; l and m each independently represent 0 or 1; n represents an integer from 15 to 150; and the ratio x:y is such that x:y=0 to 100:100 to 0; provided that $R^1$ and $R^2$ do not represent hydroxyl groups at the same time.

It is preferable that the resin composition for sealing an electronic device further includes (C) a reactive diluent, and the mass ratio between the component (A) and the component (C), (A):(C), is 5:95 to 70:30.

Furthermore, it is preferable that the resin composition for sealing an electronic device further includes (D) a hydrocarbon compound having a number average molecular weight of less than 50,000, and the mass ratio of the sum of the component (A) and the component (C) to the component (D), [(A)+(C)]:(D), is 20:80 to 70:30.

Furthermore, in regard to the resin composition for sealing an electronic device, it is preferable that the hydrocarbon compound of the component (D) includes at least (d1) a hydrocarbon-based softening agent and (d2) a hydrocarbon-based tackifier, and the mass ratio between the component (d1) and the component (d2), (d1):(d2), is 20:80 to 80:20.

Furthermore, it is preferable that the reactive diluent of the component (C) is a bifunctional (meth)acrylate monomer.

In regard to the resin composition for sealing an electronic device, it is preferable that the hydrocarbon-based softening agent of the component (d1) is polybutene or/and polyisobutylene.

Furthermore, in regard to the resin composition for sealing an electronic device, it is preferable that the hydrocarbon-based tackifier of the component (d2) is a hydrogenated petroleum resin.

Furthermore, in regard to the resin composition for sealing an electronic device, it is preferable that the polybutadiene polymer has 50% or more of the unsaturated bonds in the butadiene skeleton hydrogenated.

Furthermore, in order to solve the problems described above, the electronic device according to the invention is characterized by being sealed by a sealing material using the resin composition for sealing an electronic device according to any one of the above-described items.

It is preferable that the electronic device has flexibility.

Furthermore, it is preferable that the electronic device is an organic device and has an organic active component part, and the sealing material is disposed on, above, or around the organic active component part.

The organic device is an organic electroluminescent device, and the organic active component part may be composed of an anode, a light emitting layer, and a cathode.

Furthermore, the electronic device is a touch screen and has a substrate formed from glass or a polymer; and a substantially transparent electroconductive metal disposed on the substrate, and the sealing material may be disposed on, above, or around the metal.

The electronic device is a photovoltaic device and has a photovoltaic cell or a photovoltaic cell array, and the sealing material may be disposed on, above, or around the photovoltaic cell or any arbitrary one photovoltaic cell in the photovoltaic cell array.

Furthermore, the electronic device is a thin film transistor and has a semiconductor layer, and the sealing material may be disposed on, above, or around the semiconductor layer.

Effect of the Invention

The resin composition for sealing an electronic device according to the invention can seal an electronic device without trapping air between the resin composition and a substrate, and can suppress the permeation of water vapor. Also, since the electronic device according to the invention is sealed using the resin composition for sealing an electronic device, the electronic device is sealed without trapping air between the resin composition and a substrate, and thus deterioration of the electronic device caused by permeation of water vapor can be reduced.

MODE(S) FOR CARRYING OUT THE INVENTION

Figure 1:
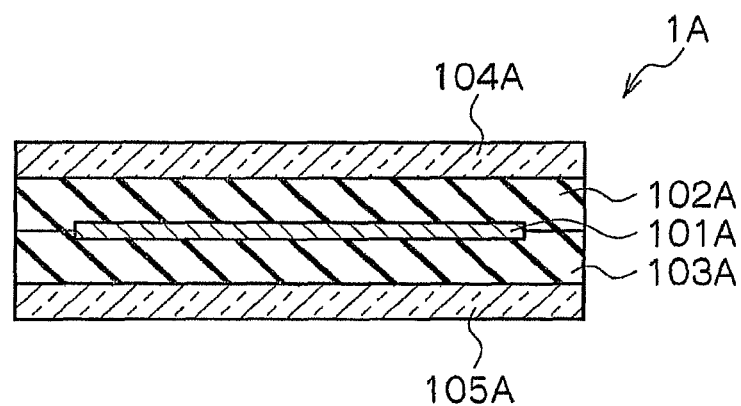
FIG. 1 is an outline cross-sectional view diagram of an exemplary photovoltaic cell.

Hereinafter, exemplary embodiments of the invention will be described in detail. Meanwhile, according to the present specification, the term "(meth)acryl" means "acryl" and/or "methacryl".

The resin composition for sealing an electronic device related to an exemplary embodiment of the invention includes (A) a polybutadiene polymer represented by the following formula (1), the polybutadiene polymer having a (meth)acryloyl group at a terminal end thereof; and (B) a photopolymerization initiator, and the resin composition does not include a thermoplastic resin having a mass average molecular weight of 50,000 or more.

[Chemical Formula 1]

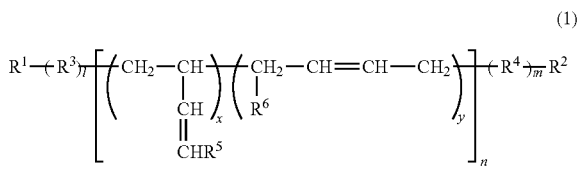

(1)

wherein $R^1$ and $R^2$ each independently represent a hydroxyl group or $H_2C=C(R^7)-COO-$; $R^3$ and $R^4$ each independently represent a substituted or unsubstituted, non-N-containing divalent organic group having 1 to 16 carbon atoms; $R^5$, $R^6$ and $R^7$ each independently represent a hydrogen atom or an alkyl group having 1 to 10 carbon atoms; l and m each independently represent 0 or 1; n represents an integer from 15 to 150; and the ratio x:y is such that x:y=0 to 100:100 to 0; provided that $R^1$ and $R^2$ are never both a hydroxyl group.

The (A) polybutadiene polymer can be produced by, for example, transesterification and direct esterification between a hydroxyl group-terminated alkoxylated polybutadiene polymer, or/and a hydroxyl group-terminated polybutadiene polymer and a low molecular weight (meth) acrylate ester, or by a reaction between a (meth) acrylic acid halide or an anhydride. The transesterification and the direct esterification are suitable industrial methods. Particularly, in the case of transesterification, the reaction includes a transesterification reaction between a corresponding hydroxyl group-terminated alkoxylated polybutadiene polymer, or/and a hydroxyl group-terminated polybutadiene polymer and a low molecular weight (meth)acrylate ester (preferably, selected from methyl (meth)acrylate, ethyl (meth)acrylate, n-propyl or isopropyl (meth)acrylate, n-butyl or isobutyl or t-butyl (meth)acrylate). In that case, it is preferable to accelerate the transesterification reaction by means of at least one catalyst selected from a metal alkoxide, a metal oxide, a Lewis acid, another known catalyst for accelerating a transesterification reaction, or a combination thereof. As a second option, the reaction can include a direct esterification reaction by means of a corresponding hydroxyl group-terminated alkoxylated polybutadiene polymer, or/and acrylic acid or methacrylic acid, halide or anhydride of a hydroxyl group-terminated polybutadiene polymer. In regard to the direct esterification of acrylic acid or methacrylic acid, an esterification catalyst selected from sulfuric acid, p-toluenesulfonic acid methanesulfonic acid, or another known strong inorganic acid or organic acid that accelerates an esterification reaction, can be used.

The hydroxyl group-terminated alkoxylated polybutadiene polymer is produced by a process including a reaction between a hydroxyl group-terminated polybutadiene and an alkylene oxide. Specifically, an alkylene oxide can be incorporated into a polybutadiene resin according to any one of an in-situ polymerization method or a secondary reaction step between a free polybutadiene resin and an alkylene oxide. In order to form a hydroxyl group terminal, in a case in which a polybutadiene resin is produced by a process including anionic polymerization of adding an alkylene oxide to an active polymerization mixture in situ, an in-situ polymerization method is suitably used. In a case in which an alkylene oxide is added to a secondary reaction step, a polybutadiene resin can be obtained by anionic polymerization or free radical polymerization. In addition to that, the alkylene oxide may also be incorporated into the polybutadiene resin by a known method of alkoxylating an alcohol, a diol or a polyhydroxyl material.

The alkylene oxide can be selected from all known alkylene oxides. Suitable examples thereof include ethylene oxide, propylene oxide, butylene oxide, both 1,2-butylene oxide and 2,3-butylene oxide, styrene oxide, and mixtures thereof. Ethylene oxide and propylene oxide, or a mixture thereof is most suitable. The number of alkylene oxide units can be varied from 1 to about 100 per hydroxyl group. A suitable range is 1 to about 30 alkylene oxide units.

The mass average molecular weight of the polybutadiene polymer is preferably 500 or more but less than 50,000, more preferably 1,000 or more but less than 10,000, and even more preferably from 1,000 to 5,000. If the molecular weight is 50,000 or more, the effect of suppressing the permeation of water vapor is increased; however, the viscosity of the resin composition for sealing an electronic device is increased, application properties are deteriorated, and thus air may be trapped between the resin composition for sealing an electronic device and the substrate. If the molecular weight is less than 500, the crosslinking density becomes too high, and the bending resistance of the resin composition for sealing an electronic device after being cured may be insufficient. Meanwhile, the mass average molecular weight according to the invention is a value calculated through a gel permeation chromatography (GPC) analysis, based on a calibration curve produced using polystyrene standard materials.

The microstructure of the polybutadiene resin is represented by the ratio of the 1,2-structure to the 1,4-structure and the ratio of the cis-structure to the trans-structure in the 1,4-structure moiety. The amount of the 1,2-structure is often referred to as the vinyl content. The vinyl content of polybutadiene may vary from about 5% to about 90%. The ratio of the cis-structure to the trans-structure may vary from about 1:10 to about 10:1.

The polybutadiene polymer may be hydrogenated, and the two types of the 1,4-structure, such as a cis-structure and a trans-structure, are changed to an ethylene structure, while the 1,2-structure is changed to a 1-butene structure. In a case in which the amount of double bonds is reduced by hydrogenation, and thereby thermal stability, weather resistance, chemical resistance, water vapor barrier properties and the like are enhanced, 50% or more, more preferably 80% or more, and even more preferably 90% or more, of the unsaturated bonds contained in the butadiene skeleton may be hydrogenated, as illustrated in the following formulas (2) to (4). Furthermore, the polybutadiene polymer of the component (A) is a polybutadiene polymer represented by any one of formulas (2) to (4) and having a (meth) acryloyl group at either end, and is a polybutadiene polymer under the concept that 50% or more of the unsaturated bonds contained in the butadiene skeleton have been hydrogenated.

[Chemical Formula 2]

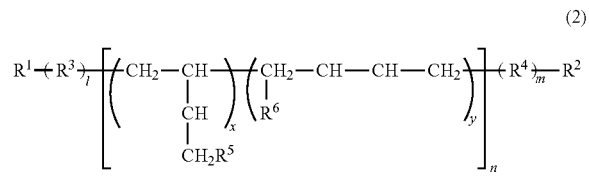

(2)

[Chemical Formula 3]

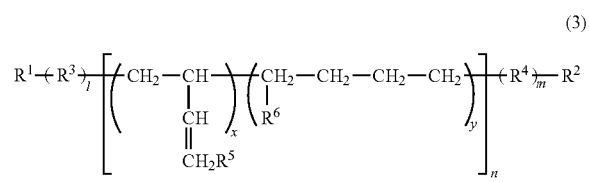

(3)

[Chemical Formula 4]

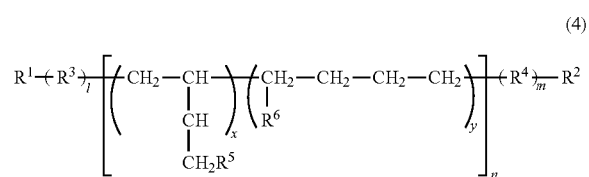

(4)

wherein in formulas (2) to (4), $R^1$ and $R^2$ each independently represent a hydroxyl group or $H_2C=C(R^7)-COO-$; $R^3$ and $R^4$ each independently represent a substituted or unsubstituted, non-N-containing divalent organic group having 1 to 16 carbon atoms; $R^5$, $R^6$ and $R^7$ each independently represent a hydrogen atom or an alkyl group having 1 to 10 carbon atoms; l and m each independently represent 0 or 1; n represents an integer from 15 to 150; and the ratio x:y is such that x:y=0 to 100:100 to 0; provided that $R^1$ and $R^2$ are never both a hydroxyl group.

On the other hand, in the case of a high-cis polybutadiene having a large proportion of the 1,4-structure, the structure after hydrogenation becomes closer to the crystalline polyethylene structure, and the glass transition temperature also increases along with an increase in the hydrogenation ratio. Furthermore, in the case in which the proportion of the 1,2-structure is large, there is a possibility that crystallinity may be exhibited if a chain of the 1,2-structure has syndiotactic or isotactic stereoregularity, and there are occasions in which these property changes cause a decrease in the application properties accompanied by an increase in viscosity, or insufficient bendability after curing. Therefore, in the case of suppressing these, the hydrogenation ratio is preferably less than 90%, and more preferably less than 80%. The average number of hydroxyl groups per molecule can be varied from about 1 to 3, and the average number of hydroxyl groups is preferably about 1.5 to 3, and more preferably 1.5 to 2.5.

A composition including the (A) polybutadiene polymer can be cured by irradiation with radiation such as ultraviolet radiation or an electron beam (EB), or by addition of a peroxide, or according to the Michael addition method.

Examples of the (B) photopolymerization initiator include a benzophenone-based photopolymerization initiator, an acetophenone-based photopolymerization initiator, a thioxanthone-based photopolymerization initiator, and a benzoin-based photopolymerization initiator.

Examples of the benzophenone-based photopolymerization initiator include KAYACURE-BP100 (benzophenone, manufactured by Nippon Kayaku Co., Ltd.), SANYO OBA (benzoylbenzoic acid, manufactured by Nippon Paper Industries Co., Ltd.), SANYO OBM (methyl benzoylbenzoate, manufactured by Nippon Paper Industries Co., Ltd.), TRIGANOL 12(4-phenylbenzophenone, Akzo Nobel N.V.), KAYACURE MBP (3,3'-dimethyl-4-methoxybenzophenone, manufactured by Nippon Kayaku Co., Ltd.), KAYACURE-BMS ([4-(methylphenylthio)phenyl]phenylmethanone, manufactured Nippon Kayaku Co., Ltd.), ESACURE TZT (2,4,6-trimethylbenzophenone, Lamberti S.p.A.), and IRGACURE 651 (2,2-dimethoxy-1,2-diphenylethan-1-one, manufactured by BASF SE).

Examples of the acetophenone-based photopolymerization initiator include, for example, DAROCUR 1173 (2-hydroxy-2-methyl-1-phenylpropan-1-one, manufactured by BASF SE), DAROCUR 1116 (1-(4-isopropylphenyl)-2-hydroxy-2-methylpropan-1-one, manufactured by BASF SE), IRGACURE 184 (1-hydroxycyclohexyl phenyl ketone, manufactured by BASF SE), DAROCUR 953 (1-(4-dodecylphenyl)-2-hydroxy-2-methylpropan-1-one, manufactured by BASF SE), and DAROCUR 2959 (4-(2-hydroxyethoxy)-phenyl (2-hydroxy-2-propyl) ketone, manufactured by BASF SE).

Examples of the thioxanthone-based photopolymerization initiator include NISSOCURE TX (thioxanthone, manufactured by Nippon Soda Co., Ltd.), NISSOCURE MTX (2-methylthioxanthone, manufactured by Nippon Soda Co., Ltd.), KAYACURE RTX (2,4-dimethylthioxanthone, manufactured by Nippon Kayaku Co., Ltd.), KAYACURE CTX (2,4-dichlorothioxanthone, manufactured by Nippon Kayaku Co. Ltd.), KAYACURE DETX (2,4-diethylthioxanthone, manufactured by Nippon Kayaku Co., Ltd.), and KAYACURE DITX (2,4-diisopropylthioxanthone, manufactured by Nippon Kayaku Co., Ltd.).

Examples of the benzoin-based photopolymerization initiator include NISSOCURE BO (thioxanthone, manufactured by Nippon Soda Co., Ltd.), NISSOCURE MBO (benzoin methyl ether, manufactured by Nippon Soda Co., Ltd.), NISSOCURE EBO (benzoin ethyl ether, manufactured by Nippon Soda Co., Ltd.), and IRGACURE 65 (benzyl methyl ketal, manufactured by BASF SE).

Examples of other photopolymerization initiators include 1-phenyl-1,2-propanedione-2-(o-ethoxycarbonyl)oxime, and examples under their trade name include QUANTACURE PDO (manufactured by Ward Blenkinsop & Co., Ltd.).

The amount of the photopolymerization initiator is an effective amount, and typically, the amount is in the range of 0.01 parts to 20 parts by mass relative to 100 parts by mass of the (meth)acrylate. When such a composition is adopted, the polymerization reaction involving a reaction for producing an active ingredient can be appropriately controlled. The selection of the photopolymerization initiator at least partially depends on the (meth)acrylate used in the resin composition for sealing and on the desired curing rate, and one kind or two or more kinds thereof may be used at any arbitrary mixing ratio.

The resin composition for sealing an electronic device according to the invention does not include a thermoplastic resin having a mass average molecular weight of 50,000 or more. If the resin composition includes a thermoplastic resin having amass average molecular weight of 50,000 or more, the viscosity increases, and application properties are deteriorated.

It is preferable that the resin composition for sealing an electronic device according to the invention includes (C) a reactive diluent. The (C) reactive diluent is intended to lower the viscosity of the resin composition for sealing an electronic device, and to thereby make the coating operation easier. Furthermore, the reactive diluent can be polymerized at the time of curing of the resin composition for sealing an electronic device, and therefore, the reactive diluent has low moisture permeability compared to other simple diluent components, and can hinder, or suppress to the minimum level, the exposure of the electronic constituent elements and the organic active component part to be sealed, to moisture. Moreover, in a case in which an optimal amount of the reactive diluent is incorporated, the water vapor barrier properties can be enhanced. Also, since the reactive diluent is polymerized, an electronic device can be sealed, almost without causing an increase in the amount of low molecular weight components included in the resin composition for sealing an electronic device, and the corrosion of metal constituent elements such as electrodes in the device is hindered or suppressed to the minimum level.

Regarding the (C) reactive diluent, a liquid photopolymerizable monovinyl monomer or the like selected from, for example, a vinyl ester such as vinyl acetate, a (meth)acrylic monomer, a N-vinyl monomer, and a polythiol compound can be used, and from the viewpoint that an effect of decreasing the viscosity is provided, and the (A) polybutadiene polymer and the curing system can be similarly and easily controlled, a (meth)acrylic monomer is preferred.

Examples of the (meth)acrylic monomer include n-butyl (meth)acrylate, 2-ethylhexyl (meth)acrylate, lauryl (meth) acrylate, isomyristyl (meth)acrylate, isostearyl (meth) acrylate, n-octadecyl (meth) acrylate, 2-hydroxyethyl (meth) acrylate, 2-hydroxypropyl (meth) acrylate, 3-hydroxypropyl (meth) acrylate, 4-hydroxybutyl (meth) acrylate, isobornyl (meth) acrylate, dicyclopentenyl (meth) acrylate, dicyclopentenyloxyethyl (meth) acrylate, morpholine (meth)acrylate, 1,4-butanediol di(meth)acrylate, dicyclopentadiene dimethylol (meth) acrylate, cyclohexanedimethylol di(meth) acrylate, hexanediol di(meth)acrylate, nonanediol di(meth) acrylate, phenoxyethyl acrylate, tricyclodecane dimethanol di(meth)acrylate, trimethylolpropane tri(meth)acrylate, tris (2-hydroxyethyl) isocyanurate tri(meth)acrylate, and an ester between (meth) acrylic acid and a polyhydric alcohol. Among these, from the viewpoint of obtaining a significant effect of decreasing the viscosity and obtaining high water vapor barrier properties, a polyfunctional (meth)acrylate monomer is preferred, and a bifunctional (meth)acrylate monomer is more preferred. Furthermore, hexanediol di(meth)acrylate, tricyclodecane dimethanol di(meth)acrylate, and 1,4-butanediol di(meth)acrylate, which can increase the effect of enhancing the water vapor barrier properties when combined with the (A) polybutadiene polymer, are preferred.

Examples of the N-vinyl monomer include N,N-dimethylacrylamide, N-vinylpyrrolidone, and N-vinylcaprolactam. The polythiol compound is not particularly limited as long as the compound is a polythiol compound having 2 to 6 mercapto groups in the molecule, and examples thereof include an aliphatic polythiol such as an alkanedithiol having about 2 to 20 carbon atoms; an aromatic polythiol such as xylylenedithiol; a polythiol obtained by substituting a halogen atom of a halohydrin adduct of an alcohol with a mercapto group; a polythiol formed from an hydrogen sulfide reaction product of a polyepoxide compound; and a polythiol formed from an esterification product of a polyhydric alcohol having 2 to 6 hydroxyl groups in the molecule, and thioglycolic acid, β-mercaptopropionic acid or β-mercaptobutanoic acid.

The content ratio (A):(C) between the component (A) and the component (C) in the resin composition for sealing an electronic device of the invention is essentially 5:95 to 70:30 as a mass ratio, preferably 10:90 to 60:40, more preferably 20:80 to 60:40, and even more preferably 20:80 to 50:50, from the viewpoints of the viscosity and the water vapor barrier properties. When the amounts of the component (A) and the component (C) are adjusted to an optimal content ratio, the viscosity can be decreased, and the water vapor barrier properties can be significantly enhanced. If the content ratio is not optimal, the viscosity decreasing effect may be reduced, and the coating conditions can be limited, or there are occasions in which even if the viscosity is decreased, there may be no effect on the water vapor barrier properties.

It is preferable that the resin composition for sealing an electronic device of the invention includes (D) a hydrocarbon compound having a number average molecular weight of less than 50,000. According to the invention, the hydrocarbon compound of the component (D) provides effects of lowering the moisture permeability of the resin composition for sealing an electronic device and suppressing the exposure of the electronic constituent elements and the organic active component part to be sealed, to moisture.

The hydrocarbon compound may have various number average molecular weights; however, the number average molecular weight is preferably 300 or more but less than 50,000, more preferably 500 or more but less than 30,000, and even more preferably from 500 to 10,000. When the molecular weight is adjusted to be less than 50,000, the water vapor barrier properties can be enhanced without significantly increasing the viscosity of the resin composition for sealing an electronic device. If the number average molecular weight is less than 300, since the resin composition for sealing an electronic device seals an organic active component part directly or via a thin coating film, the organic active component part to be sealed, particularly an electrode layer formed from a metal layer having a low work function, is affected, and the service life of the device may be shortened. Also, even if the number average molecular weight is less than 50,000, if the mass average molecular weight is 50,000 or more, the viscosity of the resin composition for sealing an electronic device is significantly increased, and application properties are markedly impaired, which is not preferable.

Regarding the content ratio of the sum of the component (A) and the component (C) to the component (D), [(A)+(C)]:(D), in the resin composition for sealing an electronic device of the invention, the components can be mixed at a ratio of 20:80 to 70:30 as a mass ratio from the viewpoints of the water vapor barrier properties, viscosity, and bending resistance after curing, and the content ratio [(A)+(C)]:(D) is preferably 30:70 to 50:50.

The hydrocarbon compound may be a saturated hydrocarbon compound, or may be an unsaturated hydrocarbon compound. The unsaturated bond such as a carbon-carbon double bond may be modified by hydrogenation, maleylation, epoxylation, amination, or a similar method. Hydrogenation is preferred because the water vapor barrier properties, transparency, and the compatibility with other saturated hydrocarbon compounds may be enhanced. Maleylation, epoxylation and amination are preferred because the adhesiveness for adhering a cover and a substrate to each other, and the compatibility with other functional group-containing compounds may be enhanced.

Examples of the hydrocarbon compound that can be used include, but are not limited to, naphthene oil, paraffin oil, a low molecular weight polyisobutylene resin, liquid rubbers such as polybutene and polyisoprene, low molecular weight polyethylene, low molecular weight polypropylene, a cycloolefin polymer, a petroleum resin, a rosin-based resin, a terpene-based resin, and derivatives thereof.

In the case of using a hydrocarbon compound, one kind of hydrocarbon compound, or a combination of plural kinds of hydrocarbon compounds may be used. However, the inventors of the invention conducted a thorough investigation, and as a result, the inventors found that when the resin composition includes at least (d1) a hydrocarbon-based softening agent having a plasticization effect in addition to the water vapor barrier properties, and (d2) a hydrocarbon-based tackifier having an adhesiveness enhancing effect in addition to the water vapor barrier properties, high water vapor barrier properties can be obtained at a lower viscosity.

The mechanism by which low viscosity and high water vapor barrier properties are obtained when the (d1) hydrocarbon-based softening agent and the (d2) hydrocarbon-based tackifier are used in combination, is not clearly known; however, the mechanism is speculated to be as follows. That is, since the hydrocarbon compound of the component (D) is a low molecular weight compound, the component (D) does not significantly increase the viscosity of the resin composition for sealing an electronic device before curing. On the other hand, after curing, it is speculated that the hydrocarbon compound molecules of the component (D) go into the interior of the network structure formed when the component (A) and the component (B), or the components (A) to (C), are polymerized, and are embedded in the voids of the network structure, and thus the water vapor barrier properties are enhanced. Here, if only the (d2) hydrocarbon-based tackifier is present without the (d1) hydrocarbon-based softening agent having a plasticization effect, it is speculated that the hydrocarbon compound molecules cannot go into the network structure so as to be embedded in the voids, or even if the molecules can penetrate into the network structure, the structure becomes so hard that voids are generated, and therefore, the water vapor barrier properties are not enhanced. In contrast, if only the (d1) hydrocarbon-based softening agent is present without having the (d2) hydrocarbon-based tackifier, it is speculated that even if the hydrocarbon-based softening agent molecules are embedded into the network structure, since the water vapor gas barrier properties of the hydrocarbon compound itself are insufficient, the water vapor barrier properties are hardly enhanced.

Specific examples of the (d1) hydrocarbon-based softening agent include, but are not limited to, CALSOL 5120 (naphthene-based oil, Calumet Lubricants Co., Ltd.), KAYDOL (paraffin-based, white mineral oil, manufactured by Witco Corp.), TETRAX (manufactured by Nippon Oil Co., Ltd.), PARAPOL 1300 (manufactured by Exxon Mobil Chemical Corp.), INDOPOL H-300 (manufactured by Amoco Chemicals Corp.), GLISSOPAL (low molecular weight polyisobutylene, manufactured by BASF SE), NISSEKI POLYBUTENE (polybutene having a long-chained hydrocarbon molecular structure obtainable by cationically polymerizing isobutene as a main component with a partial amount of normal-butene, manufactured by JX Nippon Oil & Energy Corp.), NISSAN POLYBUTENE (polybutene obtained by cationically polymerizing isobutene and normal-butene, manufactured by NOF Corp.), PARLEAM (hydrogenated polybutene, manufactured by NOF Corp.), KURAPRENE LIR (liquid isoprene rubber, manufactured by Kuraray Co., Ltd.), and KURAPRENE LBR (liquid butadiene rubber, manufactured by Kuraray Co., Ltd.).

Examples of the (d2) hydrocarbon-based tackifier include, but are not limited to, CLEARON (hydrogenated terpene-based resin, manufactured by Yasuhara Chemical Co., Ltd.), ESTERGUM and SUPER ESTER (hydrogenated rosin-based resin or hydrogenated rosin ester-based resin, manufactured by Arakawa Chemical Industries, Ltd.), PINE-CRYSTAL (disproportionated rosin-based resin or disproportionated ester rosin-based resin, manufactured by Arakawa Chemical Industries, Ltd.), ESCOREZ 5300 and 5400 series (C5-based hydrogenated dicyclopentadiene-based resin obtained by copolymerizing C5-fractions such as pentene, isoprene, piperine and 1,3-pentadiene produced by thermal cracking of petroleum naphtha, manufactured by Exxon Mobil Chemical Corp.), EASTOTAC (C5-based hydrogenated dicyclopentadiene-based resin, manufactured by Eastman Chemical Co.), ESCOREZ 5600 series (partially hydrogenated aromatic modified dicyclopentadiene-based resin, Exxon Mobil Chemical Corp.), ARCON (C9-based hydrogenated petroleum resin obtained by copolymerizing C9-fractions such as indene, vinyltoluene and α- or β-methylstyrene produced by thermal cracking of petroleum naphtha, manufactured by Arakawa Chemical Industries, Ltd.), and I-MARV (hydrogenated petroleum resin obtained by copolymerizing C5-fractions and C9-fractions, manufactured by Idemitsu Kosan Co., Ltd.).

Examples other than those compounds described above include C5, C9 and C5/C9 hydrocarbon resins as non-hydrogenated alicyclic hydrocarbon resins, polyterpene resins, aromatic modified polyterpene resin, and rosin derivatives. In a case in which a non-hydrogenated alicyclic hydrocarbon resin is used, the hydrocarbon resin is typically used in combination with another hydrogenated or partially hydrogenated tackifier. The non-hydrogenated alicyclic hydrocarbon resin may also be used in an amount of less than about 30% by mass relative to the total weight of the resin composition for sealing an electronic device.

The hydrocarbon-based tackifier may include a hydrogenated petroleum resin, specifically a hydrogenated alicyclic petroleum resin. Specific examples of the hydrogenated alicyclic petroleum resin include ESCOREZ 5300 series (manufactured by Exxon Mobil Chemical Corp.) and I-MARV P series (manufactured by Idemitsu Kosan Co., Ltd.). The hydrogenated alicyclic petroleum resin may be a hydrogenated dicyclopentadiene-based resin, due to its high water vapor barrier properties and high transparency. The mass average molecular weight of the hydrogenated alicyclic petroleum resin that can be used for the resin composition for sealing an electronic device is typically 200 to 5,000, and the mass average molecular weight of the hydrogenated alicyclic petroleum resin is preferably 500 to 3,000. If the mass average molecular weight is more than 5,000, the adhesiveness may become insufficient, or the suitability with the (d1) hydrocarbon-based softening agent may be decreased.

There may be occasions in which a hydrocarbon-based tackifier has a softening temperature or a softening point (softening temperature by the ring and ball method) that can vary at least partially depending on the adhesiveness of the resin composition for sealing an electronic device, the use temperature, and the coating conditions. The softening temperature by the ring and ball method can be generally adjusted to about 50° C. to 200° C., and is preferably about 80° C. to 150° C. Since the range of the softening temperature by the ring and ball method of commercially available general hydrocarbon-based tackifiers is the range described above, these tackifiers may be used. For example, in the ESCOREZ 5300 series, the softening point of ESCOREZ 5380 is 86° C., the softening point of ESCOREZ 5300 is 105° C., the softening point of ESCOREZ 5320 is 124° C., and the softening point of ESCOREZ 5340 is 140° C. Thus, the hydrocarbon-based tackifier can be appropriately selected among them.

In a case in which the (d1) hydrocarbon-based softening agent and the (d2) hydrocarbon-based tackifier are used, a combination of polybutene as the (d1) hydrocarbon-based softening agent and a hydrogenated dicyclopentadiene-based resin as the (d2) hydrocarbon-based tackifier can be used. Furthermore, a combination of polybutene as the (d1) hydrocarbon-based softening agent and a non-hydrogenated alicyclic hydrocarbon resin as the (d2) hydrocarbon-based tackifier can be used; however, the examples are not limited to these.

In regard to the resin composition for sealing an electronic device of the invention, when the resin composition includes a large amount of the (d1) hydrocarbon-based softening agent, the water vapor barrier properties and the bending resistance after curing are enhanced, and when the resin composition includes a large amount of the (d2) hydrocarbon-based tackifier, the water vapor barrier properties are significantly enhanced, which is preferable. Since the (d2) hydrocarbon-based tackifiers are mostly hydrophobic compounds derived from petroleum, refined oil, and pine resin, the tackifiers have high water vapor barrier properties. When the content ratio between the components (d1) and (d2), (d1) (d2), is 20:80 to 80:20 as a mass ratio, a synergistic effect can be obtained.

The resin composition for sealing an electronic device may have added thereto a filler, a coupling agent, an ultraviolet absorber, an ultraviolet stabilizer, an oxidation inhibitor, a stabilizer, or a combination of any of these. The amount of the additives is typically selected so as not to adversely affect the curing rate of the (A) polybutadiene polymer, or so as not to adversely affect the physical characteristics of the resin composition for sealing an electronic device.

Examples of the filler that can be used include, but are not limited to, carbonates of calcium or magnesium (for example, calcium carbonate, magnesium carbonate, and dolomite), silicates (for example, kaolin, calcined clay, pyrophyllite, bentonite, sericite, zeolite, talc, attapulgite, and wollastonite), silicic acid (for example, diatomaceous earth and silica), aluminum hydroxide, pearlite, barium sulfate (for example, precipitated barium sulfate), calcium sulfate (for example, gypsum), calcium sulfite, carbon black, zinc oxide, and titanium dioxide.

The filler may have different particle sizes. For example, in a case in which it is preferable to provide a resin composition for sealing an electronic device, which has a high transmittance in the visible light region, the average primary particle size of the filler is preferably in the range of 1 nm to 100 nm, and more preferably in the range of 5 nm to 50 nm. Also, in a case in which a filler having a plate shape or a scale shape is used in order to improve low moisture permeability, the average particle size of the filler is preferably in the range of 0.1 µm to 5 µm, and from the viewpoint of the dispersibility of the filler in the resin composition for sealing, a hydrophobically surface-treated hydrophilic filler can be used. A hydrophobically surface-treated hydrophilic filler can be obtained by modifying any conventional hydrophilic filler through a hydrophobic treatment. For example, the surface of a hydrophilic filler can be treated with an alkyl containing a hydrophobic group, such as n-octyltrialkoxysilane; an alkyl or alkylsilane coupling agent; a silylating agent such as dimethyldichlorosilane or hexamethyldisilazane; a polydimethylsiloxane having hydroxyl group terminals; a higher alcohol such as stearyl alcohol; or a higher fatty acid such as stearic acid. Meanwhile, the average particle size according to the invention can be determined by a laser diffraction scattering type particle size distribution analysis method.

Examples of a silica filler include, but are not limited to, commercially available products such as products treated with dimethyldichlorosilane, for example, AEROSIL-R972, R974 or R9768 (manufactured by Nippon Aerosil Co., Ltd.); products treated with hexamethyldisilazane, for example, AEROSIL-RX50, NAX50, NX90, RX200 or RX300 (manufactured by Nippon Aerosil Co., Ltd.); products treated with octylsilane, for example, AEROSIL-R805 (manufactured by Nippon Aerosil Co., Ltd.); and products treated with dimethylsilicone oil, for example, AEROSIL-RY50, NY50, RY200S, R202, RY200 or RY300 (manufactured by Nippon Aerosil Co., Ltd.), and CAB ASIL TS-720 (manufactured by Cabot Co., Ltd.).

The filler may be used singly or in combination of plural kinds. In the case of including a filler, the amount of the filler to be added is generally 0.01% to 20% by mass relative to the total amount of the resin composition for sealing an electronic device.

Furthermore, the adhesiveness of the composition for sealing an electronic device may also be improved by adding a coupling agent that is not used as a particle surface modifying agent. Such a coupling agent typically has a moiety which reacts or interacts with an organic component, and a moiety which reacts or interacts with an inorganic component. Examples of useful coupling agents include methacryloxypropylmethyldimethoxysilane (manufactured by Shin-Etsu Chemical Co., Ltd., KBM502), 3-mercaptopropylmethyldimethoxysilane (manufactured by Shin-Etsu Chemical Co., Ltd., KBM802), and glycidylpropyltrimethoxysilane (manufactured by Shin-Etsu Chemical Co., Ltd., KBM403).

Examples of the ultraviolet absorber include, but are not limited to, a benzotriazole-based compound, an oxazolic acid amide-based compound, and a benzophenone-based compound. In the case of using an ultraviolet absorber, the ultraviolet absorber can be used in an amount of about 0.01% by mass to 3% by mass relative to the total amount of the resin composition for sealing.

Examples of the oxidation inhibitor that can be used include, but are not limited to, a hindered phenol-based compound and a phosphoric acid ester-based compound. In the case of using an oxidation inhibitor, the oxidation inhibitor can be used in an amount of about 0.01% to 2% by mass relative to the total amount of the resin composition for sealing.

Examples of a stabilizer that can be used include, but are not limited to, a phenolic stabilizer, a hindered amine-based stabilizer, an imidazole-based stabilizer, a dithiocarbamate-based stabilizer, a phosphorus-based stabilizer, a sulfur ester-based stabilizer, and phenothiazine. In the case of using a stabilizer, the stabilizer can be used in an amount of about 0.001% to 3% by mass relative to the total amount of the resin composition for sealing.

The resin composition for sealing an electronic device can be prepared by various known methods. For example, the resin composition for sealing an electronic device can be prepared by completely mixing the compounds described above. In order to mix the composition, any arbitrary mixing machine such as a kneader or a three-roll can be used. The composition thus obtainable can be used as a resin composition for sealing an electronic device, or can be combined with other components to form a resin composition for sealing an electronic device.

The resin composition for sealing an electronic device according to the invention can seal an electronic device by coating a substrate, a cover, or any arbitrary constituent element of an electronic device with the resin composition using a screen printing method or a similar method. The coating of a substrate or the like with the resin composition for sealing an electronic device can be carried out by known methods, for example, die coating, spin coating, doctor blade coating, and calendering. Also, upon sealing, the resin composition for sealing an electronic device may be bonded at normal temperature (25° C.) to 100° C., and preferably normal temperature (25° C.) to 80° C., without applying pressure, or may be bonded by applying pressure for 30 seconds to 5 minutes at a pressure of 1.0 MPa or less. Thereafter, the resin composition for sealing an electronic device according to the invention is allowed to seal an electronic device as a sealing material, by curing the resin composition by irradiation with ultraviolet radiation or the like. The thickness of the sealing material can be appropriately designed, and for example, the thickness can be adjusted to various thicknesses such as a thickness of about 5 μm to 200 μm, a thickness of about 10 μm to 100 μm, or a thickness of about 25 μm to 100 μm.

Since the resin composition for sealing an electronic device according to the invention includes only a slight amount of water or does not include any water, the adverse influence of moisture by the resin composition for sealing an electronic device itself on an electronic device is suppressed to the minimum level. Furthermore, since the resin composition for sealing an electronic device has low permeability to moisture, the exposure of an electronic constituent element or an organic active component to be sealed, to moisture can be hindered or can be suppressed to the minimum level. Also, since the resin composition for sealing an electronic device can be designed to include only a slight amount of acidic components or to not include any acidic components, the corrosion of metal constituent elements such as electrodes in an electronic device is hindered or suppressed to the minimum level.

Furthermore, the resin composition for sealing an electronic device according to the invention exhibits satisfactory adhesive characteristics. Furthermore, since the resin composition for sealing an electronic device has sufficient application properties, air is almost not captured or is not captured at all as the voids inside the electronic device to be sealed. Furthermore, the resin composition for sealing an electronic device according to the invention can reduce the release of gas, which frequently causes a problem in the adhesive used for electronic device applications. Also, handleability of the resin composition for sealing an electronic device according to the invention can be improved by applying the resin composition on a substrate film, or by molding the resin composition into a sheet form by applying the resin composition and irradiating the resin composition with ultraviolet radiation at a low level of less than 1 J/cm$^2$, with which the resin composition for sealing is not cured, to form an adhesive encapsulation layer. Meanwhile, according to the present specification, a sheet including a substrate film and an adhesive encapsulation layer is referred to as a sheet for adhesive encapsulation. In a case in which encapsulation is performed using a sheet for adhesive encapsulation, the sheet may be laminated by hot pressing the sheet at 50° C. to 100° C. for 30 seconds to 5 minutes at a pressure of 0.3 MPa to 1.0 MPa.

The resin composition for sealing an electronic device according to the invention may have a high transmittance (at least about 80%) in the visible region of the electromagnetic spectrum (wavelength region at about 380 nm to about 800 nm). In a case in which the resin composition for sealing an electronic device has a high transmittance in the visible region, an electronic device can be sealed by disposing the resin composition as a sealing material on the side of the light emitting surface or the light receiving surface of the electronic device without blocking light.

In addition, the resin composition for sealing an electronic device according to the invention can be used in a variety of electronic devices. In an electronic device in which the resin composition for sealing an electronic device according to the invention has been applied, the occurrence of inconveniences of sealing by which distortion or detachment of the substrate occurs as a result of impact or vibration, can be suppressed to the minimum level. Also, as an electronic device which can use the resin composition for sealing an electronic device with enhanced bending resistance after curing, a flexible display may be mentioned. Other kinds of the electronic device in which the resin composition for sealing an electronic device can be used, include an organic light emitting diode, a photovoltaic cell, a thin film transistor, and a touch screen.

Next, the case in which the electronic device is an organic electroluminescent device will be described. An organic electroluminescent device includes an organic active component part light emitting unit having at least an anode, a light emitting layer and a cathode, and a sealing material is formed on, above, or around the organic active component part, by applying and curing any one of the resin compositions for sealing an electronic device described in the present specification. Meanwhile, the organic active component part may be sealed by a sealing material obtained by respectively curing plural resin compositions for sealing an electronic device described in the present specification, or may be sealed using a sealing material formed by using the resin composition for sealing an electronic device according to the invention, in combination with another sealing material.

In an organic electroluminescent device, an organic active component part light emitting unit is also referred to as a laminate. The laminate may have various configurations, and may also include, for example, one light emitting unit or a combination of two or more light emitting units incorporated therein. Also, as one of optional constituent elements of the laminate, the laminate may also include a color filter layer.

The laminate may be supported on a substrate of a device. The substrate of the device may be rigid, may be hard (not easily bending), or may be flexible. A hard substrate may contain an inorganic material such as yttria-stabilized zirconia (YSZ), glass or a metal, or may contain a resin material such as a polyester, a polyimide, or a polycarbonate. A flexible substrate is composed of a resin material, and the substrate may contain, for example, a fluorine-containing polymer (for example, polyethylene trifluoride, polychlorotrifluoroethylene (PCTFE), or a copolymer between vinylidene fluoride (VDF) and chlorotrifluoroethylene (CTFE)), a polyimide, a polycarbonate, polyethylene terephthalate, polyethylene naphthalate, an alicyclic polyolefin, or an ethylene-vinyl alcohol copolymer.

There are no limitations on the shape, structure, dimension and the like of the device. Many of the substrates of devices have a plate shape. The device may be transparent, colorless, translucent, or opaque. The substrate may be coated with a gas blocking layer containing an inorganic material such as SiO, SiN, DLF (diamond-like film) or DLG (diamond-like glass). The gas blocking layer film may also include thereon a flexible, visible light-transmitting substrate in which a polymer layer and an inorganic layer are alternately disposed, and such a coating film is described in U.S. Pat. No. 7,018,713 B2 (Padiyath et al.). The gas blocking layer may be formed using a method such as vacuum vapor deposition, physical vapor deposition, or plasma CVD (chemical vapor deposition).

An anode generally has a function of supplying holes to an organic light emitting layer. For the anode, any known anode material can be used. The work function of the anode material is generally 4.0 eV or higher, and suitable examples of the anode material include, but are not limited to, semiconductor metal oxides such as tin oxide, zinc oxide, indium oxide, and indium tin oxide (ITO); metals such as gold, silver, chromium and nickel; and organic electrically conductive materials such as polyaniline and polythiophene. The anode usually includes, for example, a film-shaped anode formed by vacuum vapor deposition, sputtering, ion plating, CVD or plasma CVD. For some applications, the anode may be patterned by etching or the like. The thickness of the anode may vary over a wide range, and generally, the thickness can be adjusted to about 10 nm to 50 μm.

A cathode that is used together with an anode generally has a function of injecting electrons into an organic light emitting layer. For the cathode, any known cathode material can be used. The work function of the cathode material is usually 4.5 eV or lower, and suitable examples of the cathode material include, but are not limited to, alkali metals such as Li, Na, K and Cs; composite materials such as LiF/Al; alkaline earth metals such as Mg and Ca; rare earth metals such as gold silver, indium and ytterbium; and alloys such as MgAg. The cathode usually includes, for example, a film-shaped cathode formed by vacuum vapor deposition, sputtering, ion plating, CVD or plasma CVD. For some applications, the cathode may be patterned by etching or the like. The thickness of the cathode may vary over a wide range, and generally, the thickness can be adjusted to about 10 nm to 50 μm.

A light emitting unit that is disposed between the anode and the cathode may have various layer structures. For example, the light emitting unit may have a single layer structure which includes only an organic light emitting layer, or may have a multilayer structure such as organic light emitting layer/electron transport layer, hole transport layer/organic light emitting layer, hole transport layer/organic light emitting layer/electron transport layer, organic light emitting layer/electron transport layer/electron injection layer, or electron injection layer/hole transport layer/organic light emitting layer/electron transport layer/electron injection layer. The respective members of these layers will be described below.

The organic light emitting layer may contain at least one luminescent material, and may optionally contain a hole transporting material, an electron transporting material or the like. The luminescent material is not particularly limited, and any luminescent material that is usually used for the production of an organic electroluminescent device can be used. Examples of the luminescent material include a metal complex, a low molecular weight fluorescent coloring material, a fluorescent polymer compound, and a phosphorescent material. Suitable examples of the metal complex include, but are not limited to, a tris(8-quinolinolato)aluminum complex ($Alq_3$), a bis(benzoquinolinolato)beryllium complex ($BeBq_2$), a bis(8-quinolinolato)zinc complex ($Znq_2$), and a phenanthroline-based europium complex ($Eu(TTA)_3$(phen)). Suitable examples of the low molecular weight fluorescent coloring material include, but are not limited to, perylene, quinacridone, coumarine, and 2-thiophenecarboxylic acid (DCJTB). Suitable examples of the fluorescent polymer compound include, but are not limited to, poly(p-phenylenevinylene) (PPV), 9-chloromethylanthracene (MEH-PPV), and polyfluorene (PF). Suitable examples of the phosphorescent material include platinum octaethylporphyrin and a cyclometalated iridium compound.

The organic light emitting layer can be formed from luminescent materials such as those described above, using any arbitrary suitable method. For example, the organic light emitting layer can be formed using a film forming method such as vacuum vapor deposition or physical vapor deposition. The thickness of the organic light emitting layer is not particularly limited; however, generally, the thickness can be adjusted to about 5 nm to 100 nm.

The organic light emitting unit may include a hole transport layer and/or a hole injection layer, which are both formed from hole transporting materials. A hole transporting material generally has a function of ejecting holes from an anode, transporting holes, or blocking electrons that are ejected from a cathode. Suitable examples of the hole transporting material include, but are not limited to, N,N'-diphenyl-N,N'-di(m-tolyl)benzidine (TPD), N,N,N',N'-tetrakis(m-tolyl)-1,3-phenylenediamine (PDA), 1,1-bis[N,N-di(p-tolyl)amino]phenyl]cyclohexane (TPAC), and 4,4',4''-tris[N,N',N''-triphenyl-N,N',N''-tri(m-tolyl)amino]-phenylene (m-MTDATA). The hole transport layer and the hole injection layer can be respectively formed using a film forming method such as vacuum vapor deposition or physical vapor deposition. The thicknesses of these layers are not particularly limited; however, generally, the thicknesses can be respectively adjusted to 5 nm to 100 nm.

The organic light emitting unit may include an electron transport layer and/or an electron injection layer, which are both formed from electron transporting materials. An electron transporting material has a function of transporting electrons, or blocking holes that are ejected from an anode. Suitable examples of the electron transporting material include, but are not limited to, 2-(4-tertiary-butylphenyl)-5-(4-biphenyl)-1,3,4-oxadiazole (PBD), and 3-(4-tert-butylphenyl)-4-phenyl-5-(4-biphenyl)-1,2,4-triazole (TAZ) AlQ. The electron transport layer and the electron injection layer can be respectively formed using a film forming method such as vacuum vapor deposition or physical vapor deposition. The thicknesses of these layers are not particularly limited; however, generally, the thicknesses can be respectively adjusted to 5 nm to 100 nm.

In the organic electroluminescent device disclosed in the present specification, the laminate can be sealed by a sealing material which uses the resin composition for sealing an electronic device according to the invention. The sealing material can be formed in the form of a layer that covers the entire exposed surface of the laminate disposed on a substrate.

In the organic electroluminescent device, since the resin composition for sealing an electronic device according to the invention has adhesive characteristics by itself, it is not necessary to separately provide an adhesive layer in order to laminate the sealing material. That is, further lamination of an adhesive is omitted, and thus the production process can be simplified. Also, reliability can be strengthened. Furthermore, unlike the conventional technologies, since the laminate can be covered with the resin composition for sealing an electronic device, a hollow part does not remain between the laminate and the cover. If there is no hollow part, moisture permeation is reduced, and thereby deterioration of the device characteristics can be prevented, while a compact and thin device can be obtained. In a case in which it is desired to have a hollow part, a gasket of the adhesive that surrounds the device may be used.

Furthermore, the resin composition for sealing an electronic device according to the invention may have transparency in the visible region of the spectrum (380 nm to 800 nm). Since the average transmissivity of the resin composition for sealing an electronic device can be adjusted to be 80% or higher or 90% or higher, the resin composition for sealing an electronic device does not substantially reduce the light emission efficiency of an organic electroluminescent device. This is particularly beneficial for a top emission type organic electroluminescent device.

On the outside of the laminate, a passive film for protecting the top and the bottom of the laminate. A passive film is formed from an inorganic material such as SiO, SiN, DLG or DLF, and can be formed using, for example, a film forming method such as vacuum vapor deposition or sputtering. The thickness of the passive film is not particularly limited; however, generally, the thickness is about 5 nm to 100 nm.

On the outside of the laminate, a material capable of absorbing moisture and/or oxygen, or a layer formed from the material can be disposed. Such a layer may be disposed at any place as long as the desired effect is obtained.

In addition to the constituent elements described above, the organic electroluminescent device may additionally include various known constituent elements.

In a case in which a full color apparatus is desired, an organic electroluminescent device having a white light emitting part can be used in combination with color filters. Such a combination is unnecessary in the three-color light emission method. Furthermore, the organic electroluminescent device can be used in combination with an organic electroluminescent device which employs the color conversion method (CCM) or a color filter for correcting color purity.

Also, the organic electroluminescent device may have a protective film as the outermost layer. This protective film may be a protective film having water vapor blocking characteristics or oxygen blocking characteristics, and such a protective film is also referred to as a "gas blocking film" or a "gas blocking layer". The gas blocking layer can be formed from various materials having water vapor blocking characteristics. Suitable examples of the material include, but are not limited to, a polymer layer containing a fluorine-containing polymer (for example, polyethylene naphthalate, polyethylene trifluoride, polychlorotrifluoroethylene (PCTEF), a polyimide, a polycarbonate, polyethylene terephthalate, an alicyclic polyolefin, or an ethylene vinyl alcohol copolymer). Such a polymer layer, or a laminate obtainable by coating such a polymer layer with an inorganic thin film (for example, silicon oxide, silicon nitride, aluminum oxide, DLG, or DLF) using a film forming method (for example, sputtering), can also be used. Further, the gas blocking layer may have thereon a flexible, visible light transmitting substrate in which a polymer layer and an inorganic layer are alternately disposed. Regarding such a protective film, the protective film described in U.S. Pat. No. 7,018,713 B2 (Padiyath et al.) can be used. The thickness of the gas blocking layer may vary over a wide range, and generally, the thickness can be adjusted to about 10 nm to 500 μm.

The organic electroluminescent device disclosed in the present specification can be utilized as a lighting or display means in various fields. Examples of the applications include a lighting apparatus used instead of a fluorescent lamp; a display device for a computer set, a television receiver, a DVD (digital video disc), an audio equipment, a measuring equipment facility, a mobile telephone, a PDA (portable information terminal), and a panel; and a light source array for a backlight and a printer.

Furthermore, the resin composition for sealing an electronic device according to the invention may be used to encapsulate a constituent element formed from a metal or a metal oxide, which is disposed on a substrate. For example, the resin composition for sealing an electronic device may be used for a touch screen that is deposited on a substrate made of a substantially transparent electroconductive metal such as indium tin oxide (ITO) or glass, or on a polymer film of cellulose triacetate. The resin composition for sealing an electronic device does not at all include, or if present, only in a small amount of, any acidic element which has a risk of corroding metals and/or a substrate, corrosion of metals and/or a substrate can be prevented.

Furthermore, the resin composition for sealing an electronic device according to the invention may be used as a sealing material that is disposed on a photovoltaic cell, above a photovoltaic cell, or around a photovoltaic cell. The photovoltaic cell may be arranged in an array form (a series of photovoltaic cells that are mutually connected), or some or all of plural photovoltaic cells configured in an array form may be sealed by the resin composition for sealing an electronic device according to the invention.

Generally, a photovoltaic cell is a semiconductor device used to convert light to electricity, and may also be referred to as a solar cell. When a photovoltaic cell is exposed to light, a voltage is generated between a positive electrode and a negative electrode, and consequently, electrons are caused to flow therebetween. The magnitude of the voltage is proportional to the intensity of light colliding against photovoltaic junctions formed on the surface of the cell. Typically, solar cells or solar cell modules are interconnected so as to induce an official voltage in order to supply or store electric power in a predetermined apparatus, and thereby the solar cells or solar cell modules form a solar cell array which functions as a single electricity generating unit.

The semiconductor material used in a photovoltaic cell include crystalline or polycrystalline silicon or thin film silicon, for example, amorphous or semicrystalline silicone, gallium arsenide, copper indium diselenide, organic semiconductors, and CIG. In a photovoltaic cell, two kinds of a semiconductor material based on a wafer and a semiconductor material based on a thin film are used. A semiconductor material based on a wafer is a thin sheet of a semiconductor material produced by mechanically sawing a single crystal or a polycrystalline ingot, or by casting. A semiconductor material based on a thin film is a continuous layer of a semiconductor material disposed on a substrate or a supersubstrate using sputtering, a chemical vapor deposition process, or the like.

Many photovoltaic cells of waters and thin films are brittle to the extent that a module thereof requires one or more supports. The support may be formed from, for example, a glass plate rigid material, or may be formed from a flexible material, for example, a metal film and/or a sheet formed from a suitable polymer material such as a polyimide or polyethylene terephthalate. The support can be made into the uppermost layer or a substrate, which is positioned between the photovoltaic cells and a light source, and in this case, the support transmits light from the light source. Instead of this or in addition to this, the support may be a bottom layer that is positioned at the back of the photovoltaic cells.

The resin composition for sealing an electronic device can be disposed on a photovoltaic cell, above a photovoltaic cell, or around a photovoltaic cell. A photovoltaic cell can be protected from the environment, and/or the cell can be adhered to a support, by using the resin composition for sealing an electron device. The resin composition for sealing an electronic device may be applied as one of several sealing materials having the same composition or different compositions. Furthermore, the resin composition for sealing an electronic device may be applied directly on a cell and then cured, or an adhesive encapsulation layer obtained in advance by molding the resin composition for sealing an electronic device into a sheet form may be laminated on a photovoltaic cell, and then the adhesive encapsulation layer may be cured.

FIG. 1 is a diagram illustrating a fragmentary structure of a photovoltaic cell 1A, and the photovoltaic cell 1A is produced as a photovoltaic cell 101A in the state of an element is encapsulated by layers for adhesive encapsulation 102A and 103A. Also, on the outer surfaces of the layers for adhesive encapsulation 102A and 103A, a substrate on the front surface side 104A and a substrate on the back surface side 105A are respectively provided.

Figure 2:
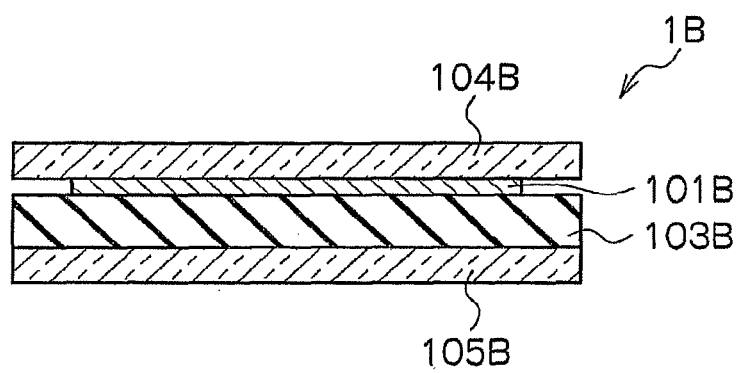
FIG. 2 is an outline cross-sectional view diagram of an exemplary photovoltaic cell.

FIG. 2 is a diagram illustrating a fragmentary structure of a photovoltaic cell 1B according to a modification example, and in the photovoltaic cell 1B, a photovoltaic cell 101B in the state of an element is disposed on a substrate on the front surface side 104B by a suitable method such as chemical vapor deposition. Then, a layer for adhesive encapsulation 103B of a sheet for adhesive encapsulation including a removable substrate film (not illustrated in the diagram) is disposed on the photovoltaic cell 101B, and the layer for adhesive encapsulation 103B is cured in a state in which the substrate film has been peeled off and then a substrate on the back surface side 105B is laminated thereon. Thereby, the photovoltaic cell 101B in the state of an element is encapsulated. In the photovoltaic cell 1B, the layer for adhesive encapsulation 103B of an adhesive encapsulation sheet including a removable substrate film is bonded to the substrate on the back surface side 105B, the substrate film is peeled off, subsequently the surface is bonded to the photovoltaic cell 101B in the state of an element, and thereby the layer for adhesive encapsulation 103B may be cured.

Figure 3:
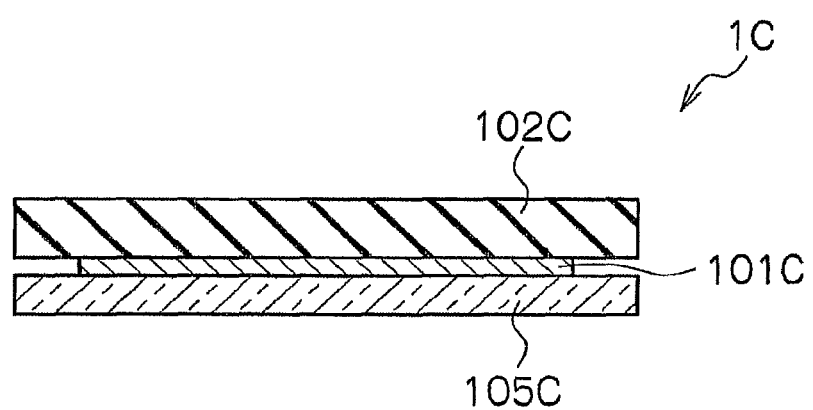
FIG. 3 is an outline cross-sectional view diagram of an exemplary photovoltaic cell.

FIG. 3 is a diagram illustrating a fragmentary structure of another exemplary photovoltaic cell 10, and a photovoltaic cell 101C in the state of an element is disposed on a substrate on the back surface side 105C by a suitable method such as chemical vapor deposition. Also, the photovoltaic cell 101C in the state of an element is sealed using, for example, a layer for adhesive encapsulation 102C of a sheet for adhesive encapsulation including a removable substrate film (not illustrated in the diagram). If necessary, a substrate on the front surface side may be utilized, and the removable substrate film may be used as a substrate on the front surface side.

The resin composition for sealing an electronic device can also be disposed on, above, or around a semiconductor layer of a thin film transistor. A thin film transistor is a field effect transistor of a special kind produced by disposing a thin film formed from a semiconductor material, and a dielectric layer and a metal that are brought into contact with a substrate. A light emitting device can be driven using a thin film transistor.

Useful semiconductor materials include those described above in connection with a photovoltaic cell, and an organic semiconductor. Examples of the organic semiconductor include aromatic or other conjugated electron systems, including small molecules such as rubrene, tetracene, pentacene, perylene diimide, and tetracyanoquinodimethane; and polymers such as polythiophene including poly(3-hexylthiophene), polyfluorene, polydiacetylene, poly(2,5-thienylenevinylene), and poly(p-phenylenevinylene). Vapor deposition of an inorganic material can be carried out using chemical vapor deposition or physical vapor deposition. Vapor deposition of an organic material can be carried out by vacuum vapor deposition of a small molecule compound, or by solution flow casting of a polymer or a small molecule compound.

A thin film transistor generally includes a gate electrode; a gate dielectric on the gate electrode; a source electrode and a drain electrode adjacent to the gate dielectric; and a semiconductor layer adjacent to the gate dielectric and adjacent to the source and drain electrodes (see, for example, S. M. Sze, Physics of Semiconductor Devices, $2^{nd}$ Edition, John Wiley and Sons, page 492, New York (1981)). These constituent elements can be assembled into various configurations.

Figure 4:
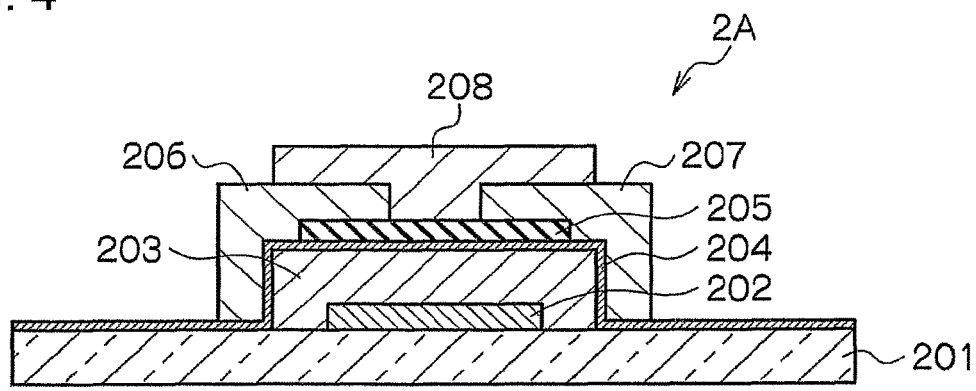
FIG. 4 is an outline cross-sectional view diagram of an exemplary thin film transistor.

An example of the thin film transistor is the thin film transistor disclosed in U.S. Pat. No. 7,279,777 B2 (Bai et al.). FIG. 4 illustrates a cross-sectional structure of such a thin film transistor 2A. The thin film transistor 2A includes a substrate 201; a gate electrode 202 disposed on the substrate 201; a dielectric material 203 disposed on the gate electrode 202; an optional surface modifying film 204 disposed on the dielectric material 203 and the substrate 201; a semiconductor layer 205 provided on the surface modifying film 204; and a source electrode 206 and a drain electrode 207 that are in contact with the semiconductor layer 205. At least a portion of the semiconductor layer 205 is sealed by a sealing material 208 produced using the resin composition for sealing an electronic device according to the invention.

Figure 5:
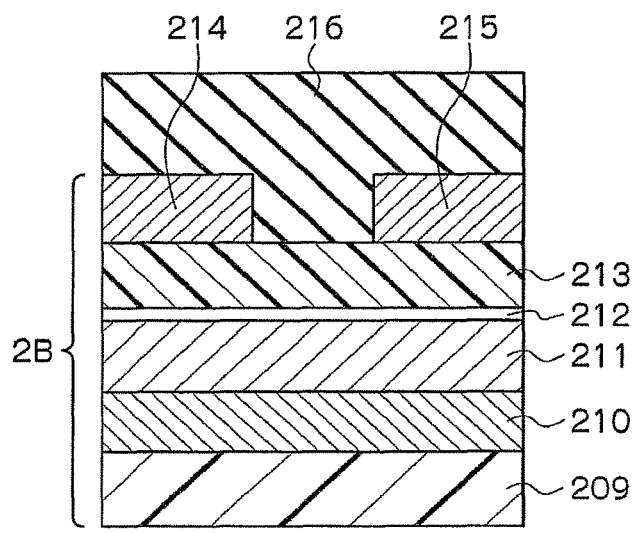
FIG. 5 is an outline cross-sectional view diagram of an exemplary thin film transistor.

Another example of the thin film transistor is an exemplary thin film transistor disclosed in U.S. Pat. No. 7,352,038 B2 (Kelley et al.). FIG. 5 illustrates a cross-sectional structure of such a thin film transistor 2B. The thin film transistor 2B includes a gate electrode 210 disposed on a substrate 209, and a gate dielectric 211 is disposed on the gate electrode 210. A substantially non-fluorinated polymer layer 212 is interposed between the gate dielectric 211 and an organic semiconductor layer 213. A source electrode 214 and a drain electrode 215 are provided on the organic semiconductor layer 213. At least a portion of the organic semiconductor layer 213 is sealed by a sealing material 216 produced using the resin composition for sealing an electronic device according to the invention.

Hereinafter, the invention will be further described by way of Examples; however, the Examples are not intended to limit the invention by any means.

EXAMPLES 1 TO 30 AND COMPARATIVE EXAMPLES 1 TO 7

The various components of the following (A), (C), (d1) and (d2) were mixed at the ratios (parts by mass) indicated in Tables 1 to 4, and the component (B) was incorporated thereinto at a proportion of 3% by mass relative to the sum of the component (A) and the component (C). Toluene was added thereto as an appropriate solvent, and thereby a solution was prepared. The solvent of the solution was removed in a vacuum vessel, and thus the respective resin compositions for sealing an electronic device of Examples 1 to 30 and Comparative Examples 1 to 7 were obtained. Evaluations of the water vapor barrier properties, application properties, and reliability of the various compositions were carried out.

(A) Polybutadiene Polymer

A1: EMA-3000 (terminal acrylic group-introduced polybutadiene, no urethane bond, Mn: 3000, manufactured by Nippon Soda Co., Ltd.)

A2: CN308 (terminal acrylic group-introduced polybutadiene, no urethane bond, hydrogenated, Mw: 4600, manufactured by Sartomer USA, LLC)

A3: TEAI-1000 (terminal acrylic group-introduced polybutadiene, having urethane bond, hydrogenated, Mn: 1000, manufactured by Nippon Soda co., Ltd.)

A4: BI-3000 (polybutadiene, no urethane bond, hydrogenated, Mn: 3000, manufactured by Nippon Soda Co., Ltd.)

Methacrylated polyisoprene: UC-203 (esterification product oligomer between a maleic anhydride adduct of an isoprene polymer and 2-hydroxyethyl methacrylate, Mn: 35,000, manufactured by Kuraray Co., Ltd.)

(B) Photopolymerization Initiator

B1: ESACURE TZT (2,4,6-trimethylbenzophenone, manufactured by Lamberti S.p.A.)

B2: ESACURE KIP100F (a blend of poly{2-hydroxy-2-methyl-1-[4-(1-methylvinyl)phenyl]propan-1-one} and 2-hydroxy-2-methyl-1-phenylpropan-1-one, manufactured by Lamberti S.p.A.)

B3: IRGACURE 819 (bis(2,4,6-trimethylbenzoyl)-phenylphosphine oxide, manufactured by BASF SE)

(C) Reactive Diluent

C1: 1.6HX-A (1,6-hexanediol diacrylate, manufactured by Kyoeisha Chemical Co., Ltd.)

C2: DCP-A (dimethyloltricyclodecane diacrylate, manufactured by Kyoeisha Chemical Co., Ltd.)

C3: CD595 (1,10-decanediol diacrylate, manufactured by Sartomer USA, LLC)

C4: LIGHT ESTER ID (isodecyl methacrylate, manufactured by Kyoeisha Chemical Co., Ltd.)

(d1) Hydrocarbon-Based Softening Agent d1-1: NISSAN POLYBUTENE 200N (polybutene, Mn: 2650, manufactured by NOF Corp.)

d1-2: GLISSOPAL 1000 (polyisobutylene, Mn: 1000, manufactured by BASF SE)

d1-3: NISSAN POLYBUTENE 015N (polybutene, Mn: 580, manufactured by NOF Corp.)

d1-4: OPPANOL B10N (polyisobutylene, Mw: 36,000, Mn: 12,000, manufactured by BASF SE)

d1-5: KURAPRENELIR30 (liquid isoprene rubber, Mw: 29,000, Mn: 28,000, manufactured by Kuraray Co., Ltd.)

d1-6: OPPANOL B15N (polyisobutylene, Mw: 75,000, Mn: 22,000, manufactured by BASF SE)

(d2) Hydrocarbon-Based Tackifier d2-1: ESCOREZ 5320 (C5-based hydrogenated dicyclopentadiene-based resin, softening point: 124° C., Mw: 640, Mn: 430, Exxon Mobile Chemical Corp.)

d2-2: I-MARV P100 (C5-dicyclopentadiene/C9-copolymer-based hydrogenated petroleum resin, softening point: 100° C., Mw: 660, manufactured by Idemitsu Kosan Co., Ltd.)

d2-3: ESCOREZ 1310 (C5-based petroleum resin, softening point: 94° C., Mw: 1600, Mn: 1000, manufactured by Exxon Mobil Chemical Corp.)

d2-4: PINECRYSTAL KE311 (hydrogenated rosin ester-based resin, softening point: 95° C., Mn: 580, manufactured by Arakawa Chemical Industries, Ltd.)

Evaluations of the water vapor barrier properties, application properties, reliability, and bending resistance of the various compositions related to the Examples and the Comparative Examples were carried out.

(Water Vapor Barrier Properties)

Each of the resin compositions for sealing an electronic device related to the Examples and the Comparative Examples was applied on a glass plate with a baker type applicator, so as to obtain a thickness of 25 µm. Thereafter, the resin composition was cured by irradiating the resin composition with ultraviolet radiation having a wavelength of 365 nm at a dose of 5 J/cm$^2$ using a high pressure mercury lamp, and thus a test sheet was obtained. The sheet thus obtained was mounted between a low-humidity chamber and a high-humidity chamber such that no creasing or sagging occurred, and the moisture permeability at 40° C. and 90% RH and the moisture permeability at 60° C. and 90% RH were determined according to JIS K7129C using a differential pressure type gas/vapor permeability measuring apparatus (manufactured by GTR Tec Corp., GTR-10XAWT) and a gas chromatograph (manufactured by Yanako Technical Science, Inc., G2700T). The water vapor barrier properties were rated into 5 grades according to the following evaluation criteria. Meanwhile, in regard to the evaluation, samples of grade D or higher grades mean acceptable products, and samples of grade E mean unacceptable products (hereinafter, the same).

A Excellent:

The moisture permeability at 60° C. is 100 g/m$^2$·day or less, and the moisture permeability at 40° C. is 20 g/m$^2$·day or less.

B Very Good:

The moisture permeability at 60° C. is 100 g/m$^2$·day or less, and the moisture permeability at 40° C. is 50 g/m$^2$·day or less.

C Good:

The moisture permeability at 60° C. is 100 g/m$^2$·day or less, and the moisture permeability at 40° C. is 100 g/m$^2$·day or less.

D Average:

The moisture permeability at 60° C. is 100 g/m$^2$·day or more, and the moisture permeability at 40° C. is 100 g/m$^2$·day or less.

E Poor:

The moisture permeabilities at 60° C. and 40° C. are both 100 g/m$^2$·day or more.

(Application Properties)

Regarding Condition 1, an experiment for applying the resin composition for sealing was performed by the following procedure. A float glass plate having a thickness of 1.2 mm according to JIS R 3202 was adjusted to a size of 30 mm×30 mm, and calcium metal was vapor deposited thereon to a thickness of 100 nm, while leaving a width of 3 mm along the four edges as bezels. Thus, a glass substrate was produced. On the other hand, a resin composition for sealing an electronic device was applied on another float glass plate so as to obtain a thickness of 25 µm. The coated glass plate and the glass substrate were combined, with the surface coated with the resin composition for sealing an electronic device facing downward, and thus a test sample having a configuration of substrate glass/resin composition for sealing an electronic device/glass was obtained. Next, two sheets of float glass plates each having a thickness of 1.2 mm as described above, and one sheet of a polyethylene terephthalate film having a thickness of 25 µm were stacked around the test sample, and the assembly was pressed for 1 minute at 80° C. and a pressure of 0.6 MPa with a vacuum laminator, while in a state of having a clearance secured. The pressed sample was removed from the laminator, and the resin composition was cured by irradiating the pressed sample with ultraviolet radiation having a wavelength of 365 nm at a dose of 5 J/cm$^2$ using a high pressure mercury lamp. Subsequently, a visual observation was made to see whether the sample was appropriately bonded, and whether the resin composition for sealing filled the space between the two sheets of glass plates without voids. Regarding Condition 2, the process was carried out under the same conditions as Condition 1, except that the pressing with a laminator was performed at normal temperature. Regarding Condition 3, the process was carried out under the same conditions as Condition 1, except that dummy wiring was provided in a stripe pattern having a height of 5 µm, a width of 150 µm, and a pitch of 2 mm, at the bezel parts of the glass substrate. Regarding Condition 4, the process was carried out under the same conditions as Condition 3, except that the pressing with a laminator was performed at normal temperature. The application properties were rated into 5 grades according to the following evaluation criteria.

A Excellent:
A sample in which no voids were observed was obtained under all of the conditions.
B Very Good:
A sample in which no voids were observed was obtained under Conditions 1, 2 and 3.
C Good:
A sample in which no voids were observed was obtained under Conditions 1 and 2.
D Average:
A sample in which no voids were observed was obtained under Condition 1.
E Poor:
Voids were observed, or bonding was not properly achieved, under any conditions.

(Reliability)

A sample in which no voids were observed in the application properties test was subjected to an environment at 40° C. and 90% RH for 1000 hours. Subsequently, the sample was cooled to room temperature (25° C.), and then the amount of moisture infiltration through the resin composition for sealing an electronic device was measured from the change in the calcium deposit film. The reliability was rated into 2 grades according to the following evaluation criteria.

A Excellent:
The amount of moisture infiltration after 1000 hours was 3 mm or less.
E Poor:
The amount of moisture infiltration after 1000 hours was 3 mm or more, or the occurrence of voids or peeling was observed.

(Bending Resistance)

Each of the resin compositions for sealing an electronic device related to the Examples and the Comparative Examples was applied on a PET film having a thickness of 100 µm, so as to obtain a thickness of 25 µm. The coated film and another PET film having a thickness of 100 µm were combined, with the surface coated with the resin composition for sealing an electronic device facing downward, such that no voids were generated therein. Subsequently, the resin composition was cured by irradiating the assembly with ultraviolet radiation having a wavelength of 365 nm at a dose of 5 J/cm$^2$ using a high pressure mercury lamp, and thus a test sample having a configuration of 100-µm thick PET film/25-µm thick resin composition for sealing/100-µm thick PET film was obtained. Next, the test sample thus obtained was subjected to a bending resistance test according to JIS K 5600-5-1 1999, using a mandrel having a diameter of 25 mm. The bending resistance was rated into 3 grades according to the following evaluation criteria.

A Excellent:
The sample could be bent, and peeling from the film, discoloration of the sample, or cracking was not observed.
D Average:
The sample could be bent, but discoloration such as whitening was observed.
E Poor:
The sample could not be bent, or peeling or cracking was observed in the sample after the test.

TABLE 1

|  | Example 1 | Example 2 | Example 3 | Example 4 | Example 5 | Example 6 | Example 7 | Example 8 | Example 9 | Example 10 |
|---|---|---|---|---|---|---|---|---|---|---|
| Polybutadiene polymer A1 | 20 |  | 20 |  | 30 |  |  |  |  | 100 |
| Polybutadiene polymer A2 |  | 30 |  | 20 |  | 50 | 30 | 30 | 30 |  |
| Polybutadiene polymer A3 |  |  |  |  |  |  |  |  |  |  |
| Polybutadiene polymer A4 |  |  |  |  |  |  |  |  |  |  |
| Methacrylated polyisoprene |  |  |  |  |  |  |  |  |  |  |
| Reactive diluent C1 |  |  |  |  |  |  |  |  |  |  |
| Reactive diluent C2 |  |  |  |  |  |  |  |  |  |  |
| Reactive diluent C3 |  |  |  |  |  |  |  |  |  |  |
| Reactive diluent C4 |  |  |  |  |  |  |  |  |  |  |
| Softening agent d1-1 | 40 | 40 | 40 |  |  |  |  | 70 |  |  |
| Softening agent d1-2 |  |  |  | 40 |  |  |  |  |  |  |
| Softening agent d1-3 |  |  |  |  | 40 |  |  |  |  |  |
| Softening agent d1-4 |  |  |  |  |  | 20 |  |  |  |  |
| Softening agent d1-5 |  |  |  |  |  |  | 20 |  |  |  |
| Softening agent d1-6 |  |  |  |  |  |  |  |  |  |  |
| Tackifier d2-1 | 40 |  |  |  |  |  |  |  |  |  |
| Tackifier d2-2 |  |  |  |  | 40 | 30 | 30 | 50 | 70 |  |
| Tackifier d2-3 |  | 30 |  |  |  |  |  |  |  |  |
| Tackifier d2-4 |  |  |  | 40 |  |  |  |  |  |  |
| Initiator B1 | ○ | ○ | ○ |  |  | ○ | ○ |  |  |  |

TABLE 1-continued

|  | Example 1 | Example 2 | Example 3 | Example 4 | Example 5 | Example 6 | Example 7 | Example 8 | Example 9 | Example 10 |
|---|---|---|---|---|---|---|---|---|---|---|
| Initiator B2 |  |  |  | ○ | ○ |  |  | ○ | ○ | ○ |
| Initiator B3 |  |  |  |  |  |  |  |  |  |  |
| Water vapor barrier properties | C | C | D | C | C | B | D | C | B | D |
| Application properties | C | C | C | C | C | D | D | C | D | B |
| Bending resistance | A | A | A | A | A | A | A | A | E | D |
| Reliability | A | A | A | A | A | A | A | A | A | A |

TABLE 2

|  | Example 11 | Example 12 | Example 13 | Example 14 | Example 15 | Example 16 | Example 17 | Example 18 | Example 19 | Example 20 |
|---|---|---|---|---|---|---|---|---|---|---|
| Polybutadiene polymer A1 |  | 30 |  |  |  |  |  |  |  |  |
| Polybutadiene polymer A2 | 50 |  | 40 | 30 | 80 | 10 | 10 | 10 | 10 | 4 |
| Polybutadiene polymer A3 |  |  |  |  |  |  |  |  |  |  |
| Polybutadiene polymer A4 |  |  |  |  |  |  |  |  |  |  |
| Methacrylated polyisoprene |  |  |  |  |  |  |  |  |  |  |
| Reactive diluent C1 | 50 |  |  |  |  |  |  |  |  |  |
| Reactive diluent C2 |  | 70 |  |  |  | 30 | 40 | 30 | 30 | 36 |
| Reactive diluent C3 |  |  | 60 |  |  |  |  |  |  |  |
| Reactive diluent C4 |  |  |  | 70 | 20 |  |  |  |  |  |
| Softening agent d1-1 |  |  |  |  |  | 30 | 20 | 12 | 48 | 30 |
| Softening agent d1-2 |  |  |  |  |  |  |  |  |  |  |
| Softening agent d1-3 |  |  |  |  |  |  |  |  |  |  |
| Softening agent d1-4 |  |  |  |  |  |  |  |  |  |  |
| Softening agent d1-5 |  |  |  |  |  |  |  |  |  |  |
| Softening agent d1-6 |  |  |  |  |  |  |  |  |  |  |
| Tackifier d2-1 |  |  |  |  |  |  |  |  |  |  |
| Tackifier d2-2 |  |  |  |  |  | 30 | 30 | 48 | 12 | 30 |
| Tackifier d2-3 |  |  |  |  |  |  |  |  |  |  |
| Tackifier d2-4 |  |  |  |  |  |  |  |  |  |  |
| Initiator B1 |  |  |  |  |  | ○ | ○ | ○ | ○ | ○ |
| Initiator B2 | ○ | ○ | ○ | ○ |  |  |  |  |  |  |
| Initiator B3 |  |  |  |  | ○ |  |  |  |  |  |
| Water vapor barrier properties | C | C | C | C | D | A | A | A | A | A |
| Application properties | A | A | A | A | B | A | A | A | A | A |
| Bending resistance | D | D | D | D | D | A | A | A | A | A |
| Reliability | A | A | A | A | A | A | A | A | A | A |

TABLE 3

|  | Example 21 | Example 22 | Example 23 | Example 24 | Example 25 | Example 26 | Example 27 | Example 28 | Example 29 | Example 30 |
|---|---|---|---|---|---|---|---|---|---|---|
| Polybutadiene polymer A1 |  |  |  |  |  |  |  |  |  |  |
| Polybutadiene polymer A2 | 28 | 10 | 15 | 18 | 32 | 20 | 10 | 10 | 10 | 3 |
| Polybutadiene polymer A3 |  |  |  |  |  |  |  |  |  |  |
| Polybutadiene polymer A4 |  |  |  |  |  |  |  |  |  |  |
| Methacrylated polyisoprene |  |  |  |  |  |  |  |  |  |  |
| Reactive diluent C1 |  |  |  |  |  |  |  |  |  |  |
| Reactive diluent C2 | 12 | 10 | 45 | 52 | 8 | 60 | 30 | 30 |  | 47 |
| Reactive diluent C3 |  |  |  |  |  |  |  |  |  |  |
| Reactive diluent C4 |  |  |  |  |  |  |  |  | 30 |  |
| Softening agent d1-1 | 30 | 30 | 20 | 15 | 30 | 10 | 6 | 54 | 30 | 20 |
| Softening agent d1-2 |  |  |  |  |  |  |  |  |  |  |
| Softening agent d1-3 |  |  |  |  |  |  |  |  |  |  |
| Softening agent d1-4 |  |  |  |  |  |  |  |  |  |  |
| Softening agent d1-5 |  |  |  |  |  |  |  |  |  |  |
| Softening agent d1-6 |  |  |  |  |  |  |  |  |  |  |
| Tackifier d2-1 |  |  |  |  |  |  |  |  |  |  |
| Tackifier d2-2 | 30 | 50 | 20 | 15 | 30 | 10 | 54 | 6 | 30 | 30 |
| Tackifier d2-3 |  |  |  |  |  |  |  |  |  |  |
| Tackifier d2-4 |  |  |  |  |  |  |  |  |  |  |
| Initiator B1 | ○ | ○ | ○ | ○ | ○ | ○ | ○ | ○ | ○ | ○ |
| Initiator B2 |  |  |  |  |  |  |  |  |  |  |
| Initiator B3 |  |  |  |  |  |  |  |  |  |  |
| Water vapor barrier properties | A | A | B | C | B | D | A | B | C | A |
| Application properties | A | B | A | A | C | A | C | B | A | A |

TABLE 3-continued

|  | Example 21 | Example 22 | Example 23 | Example 24 | Example 25 | Example 26 | Example 27 | Example 28 | Example 29 | Example 30 |
|---|---|---|---|---|---|---|---|---|---|---|
| Bending resistance | A | A | A | D | A | D | D | A | A | A |
| Reliability | A | A | A | A | A | A | A | A | A | A |

TABLE 4

|  | Comparative Example 1 | Comparative Example 2 | Comparative Example 3 | Comparative Example 4 | Comparative Example 5 | Comparative Example 6 | Comparative Example 7 |
|---|---|---|---|---|---|---|---|
| Polybutadiene polymer A1 |  |  |  |  |  |  |  |
| Polybutadiene polymer A2 |  |  |  |  |  | 30 |  |
| Polybutadiene polymer A3 | 100 | 10 |  |  |  |  |  |
| Polybutadiene polymer A4 |  |  | 10 |  |  |  |  |
| Methacrylated polyisoprene |  |  |  | 70 |  |  |  |
| Reactive diluent C1 |  |  |  |  |  |  |  |
| Reactive diluent C2 |  | 30 | 30 | 30 | 20 |  | 40 |
| Reactive diluent C3 |  |  |  |  |  |  |  |
| Reactive diluent C4 |  |  |  |  |  |  |  |
| Softening agent d1-1 |  | 30 | 30 |  |  |  |  |
| Softening agent d1-2 |  |  |  |  |  |  |  |
| Softening agent d1-3 |  |  |  |  |  |  | 30 |
| Softening agent d1-4 |  |  |  |  |  |  |  |
| Softening agent d1-5 |  |  |  |  |  |  |  |
| Softening agent d1-6 |  |  |  |  | 30 | 20 |  |
| Tackifier d2-1 |  |  |  |  | 50 |  |  |
| Tackifier d2-2 |  | 30 | 30 |  |  | 50 | 30 |
| Tackifier d2-3 |  |  |  |  |  |  |  |
| Tackifier d2-4 |  |  |  |  |  |  |  |
| Initiator B1 |  | ○ | ○ |  | ○ | ○ | ○ |
| Initiator B2 | ○ |  |  | ○ |  |  |  |
| Initiator B3 |  |  |  |  |  |  |  |
| Water vapor barrier properties | C | B | E | E | B | A | E |
| Application properties | E | E | B | C | E | E | A |
| Bending resistance | D | A | A | D | A | A | E |
| Reliability | E | E | E | E | E | E | E |

As shown in Tables 1 to 3, each of Examples 1 to 30 had a composition which included a polybutadiene polymer having a (meth)acryloyl group at a terminal end thereof and a photopolymerization initiator, but did not include a thermoplastic resin having a mass average molecular weight of 50,000 or more. Therefore, a balance was achieved between the water vapor barrier properties and application properties in the samples, and thus satisfactory results were obtained in the evaluation of reliability. Furthermore, in Examples 11 to 14 and 16 to 30, the mass ratio of the polybutadiene polymer and the reactive diluent was 6:94 to 70:30, and since the resin compositions included the reactive diluent at a ratio in the range of 5:95 to 70:30 as defined in the claims, the resin compositions exhibited improved application properties while having satisfactory water vapor barrier properties. Also, Examples 1, 2, 4 to 6, 8 and 9 included a hydrocarbon compound having an average molecular weight of less than 50,000 in an amount such that the mass ratio between the sum of the polybutadiene polymer and the reactive diluent, and the hydrocarbon compound having an average molecular weight of less than 50,000, was in the range of 20:80 to 70:30 as defined in the claims. Therefore, the resin compositions exhibited satisfactory water vapor barrier properties.

As shown in Table 4, in Comparative Example 1 and Comparative Example 2, since the polybutadiene polymer having a (meth)acryloyl group at the ends had urethane bonds, the polymer molecules formed hydrogen bonds with one another, causing an increase in viscosity, and consequently, poor application properties were obtained. In Comparative Example 3, the composition included a simple polybutadiene polymer that did not contain a (meth) acryloyl group, and consequently, poor water vapor barrier properties were obtained. In Comparative Example 4, the resin composition included a polymer which contained (meth)acryloyl groups but had a structure other than polybutadiene, and consequently, poor water vapor barrier properties were obtained. In Comparative Examples 5 and 6, since the resin compositions each included a thermoplastic resin having amass average molecular weight of 50,000 or more, even though excellent bending resistance was obtained, the viscosity increased, and consequently, poor application properties were obtained. Comparative Example 7 had a composition which did not include a polybutadiene polymer having a (meth)acryloyl group at the ends, and consequently, poor water vapor barrier properties and poor bending resistance were obtained.

EXPLANATIONS OF LETTERS OR NUMERALS 1A, 1B, 10: Photovoltaic cell
101A, 101B, 101C: Photovoltaic cell in the state of element
102A, 103A, 103B, 102C: Layer for adhesive encapsulation
104A, 104B: Substrate on the front surface side
105A, 105B, 105C: Substrate on the back surface side
2A, 2B: Thin film transistor
201, 208: Substrate
202, 209: Gate electrode 203: Dielectric material
204: Surface modifying film
205: Semiconductor layer
206, 213: Source electrode
207, 214: Drain electrode
210: Gate dielectric
211: Substantially non-fluorinated polymer layer
212: Organic semiconductor layer

The invention claimed is:

1. A resin composition for sealing an electronic device, the resin composition comprising:
   (A) a polybutadiene polymer represented by the following formula (1) and having a (meth)acryloyl group at a terminal end thereof;
   (B) a photopolymerization initiator,
   (C) a reactive diluent, and the mass ratio between the component (A) and the component (C), (A):(C), is 5:95 to 70:30; and
   (D) a hydrocarbon compound having a number average molecular weight of less than 50,000, and the mass ratio of the sum of the component (A) and the component (C) to the component (D), [(A)+(C)]:(D), is 20:80 to 70:30;
wherein
   the resin composition does not include a thermoplastic resin having a mass average molecular weight of 50,000 or more:

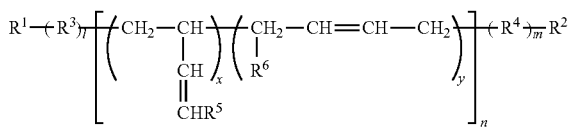
(1)

wherein $R^1$ and $R^2$ each independently represent a hydroxyl group or $H_2C=C(R^7)-COO-$ provided that $R^1$ and $R^2$ do not represent hydroxyl groups at the same time; $R^3$ and $R^4$ each independently represent a substituted or unsubstituted, non-N-containing divalent organic group having 1 to 16 carbon atoms; $R^5$, $R^6$ and $R^7$ each independently represent a hydrogen atom or an alkyl group having 1 to 10 carbon atoms; 1 and m each independently represent 0 or 1; n represents an integer from 15 to 150; and the ratio x:y is such that x:y=0 to 100:100 to 0.

2. The resin composition for sealing an electronic device according to claim 1, wherein the hydrocarbon compound of the component (D) comprises at least (d1) a hydrocarbon-based softening agent and (d2) a hydrocarbon-based tackifier, and the mass ratio between the component (d1) and the component (d2), (d1):(d2), is 20:80 to 80:20.

3. The resin composition for sealing an electronic device according to claim 1, wherein the reactive diluent (C) is a bifunctional (meth)acrylate monomer.

4. The resin composition for sealing an electronic device according to claim 2, wherein the hydrocarbon-based softening agent (d1) is polybutene and/or polyisobutylene.

5. The resin composition for sealing an electronic device according to claim 2, wherein the hydrocarbon-based tackifier (d2) is a hydrogenated petroleum resin.

6. The resin composition for sealing an electronic device according to claim 1, wherein the polybutadiene polymer has 50% or more of the unsaturated bonds in the butadiene skeleton hydrogenated.

7. An electronic device sealed with a sealing material comprising the resin composition for sealing an electronic device according to claim 1.

8. The electronic device according to claim 7, wherein the electronic device is flexible.

9. The electronic device according to claim 8, wherein the electronic device is an organic device comprising an organic active component part, wherein the sealing material is disposed on, above, or around the organic active component part.

10. The electronic device according to claim 9, wherein the organic device is an organic electroluminescent device, and the organic active component part comprises an anode, a light emitting layer, and a cathode.

11. The electronic device according to claim 8, wherein the electronic device is a touch screen comprising a substrate formed from glass or a polymer, and a substantially transparent electroconductive metal disposed on the substrate, wherein the sealing material is disposed on, above, or around the electroconductive metal.

12. The electronic device according to claim 8, wherein the electronic device is a photovoltaic device comprising a photovoltaic cell or a photovoltaic cell array, wherein the sealing material is disposed on, above, or around the photovoltaic cell or any one photovoltaic cell in the photovoltaic cell array.

13. The electronic device according to claim 8, wherein the electronic device is a thin film transistor comprising a semiconductor layer, wherein the sealing material is disposed on, above, or around the semiconductor layer.

* * * * *

UNITED STATES PATENT AND TRADEMARK OFFICE
CERTIFICATE OF CORRECTION

| | |
|---|---|
| PATENT NO. | : 10,196,547 B2 |
| APPLICATION NO. | : 15/248366 |
| DATED | : February 5, 2019 |
| INVENTOR(S) | : Masami Aoyama et al. |

Page 1 of 1

It is certified that error appears in the above-identified patent and that said Letters Patent is hereby corrected as shown below:

On the Title Page

Item (73), the Assignee's information is incorrect. Item (73) should read:
--(73) Assignee: FURUKAWA ELECTRIC CO., LTD., Tokyo (JP)--

Signed and Sealed this
Eighteenth Day of February, 2020

Andrei Iancu
*Director of the United States Patent and Trademark Office*